(12) United States Patent
Nakatsuji et al.

(10) Patent No.: US 12,538,706 B2
(45) Date of Patent: Jan. 27, 2026

(54) THERMOELECTRIC DEVICE

(71) Applicant: The University of Tokyo, Tokyo (JP)

(72) Inventors: Satoru Nakatsuji, Tokyo (JP);
Mamoru Miyawaki, Tokyo (JP); Ryota Uesugi, Tokyo (JP); Hiroto Nakamura, Tokyo (JP); Tomoya Higo, Tokyo (JP)

(73) Assignee: The University of Tokyo, Tokyo (JP)

( * ) Notice: Subject to any disclaimer, the term of this patent is extended or adjusted under 35 U.S.C. 154(b) by 147 days.

(21) Appl. No.: 18/276,961

(22) PCT Filed: Feb. 17, 2022

(86) PCT No.: PCT/JP2022/006500
§ 371 (c)(1),
(2) Date: Jan. 16, 2024

(87) PCT Pub. No.: WO2022/176966
PCT Pub. Date: Aug. 25, 2022

(65) Prior Publication Data
US 2024/0147861 A1    May 2, 2024

(30) Foreign Application Priority Data
Feb. 17, 2021 (JP) .................. 2021-023789

(51) Int. Cl.
*H10N 15/00* (2023.01)
*G01K 17/06* (2006.01)
*H10N 19/00* (2023.01)

(52) U.S. Cl.
CPC ............. *H10N 15/00* (2023.02); *G01K 17/06* (2013.01); *H10N 19/00* (2023.02)

(58) Field of Classification Search
CPC ......... H10N 15/00; H10N 19/00; G01K 17/06
See application file for complete search history.

(56) References Cited

U.S. PATENT DOCUMENTS

2003/0056570 A1* 3/2003 Shin ..................... G01N 25/32
73/25.05
2006/0243317 A1* 11/2006 Venkatasubramanian ...................
H10N 10/13
136/206

(Continued)

FOREIGN PATENT DOCUMENTS

JP         5-259514 A      10/1993
JP       2003-156461 A      5/2003
(Continued)

OTHER PUBLICATIONS

Sano, JP2005-098845, Machine Translation (Year: 2005).*
(Continued)

*Primary Examiner* — Devina Pillay
(74) *Attorney, Agent, or Firm* — WHDA, LLP

(57) ABSTRACT

A thermoelectric device includes: a sheet-like or plate-like thermoelectric conversion film including a thermoelectric conversion element formed with a material exhibiting an anomalous Nernst effect; and a catalyst portion formed with a catalyst that reacts with a fluid the catalyst portion being on the side of at least a first surface of the thermoelectric conversion film and facing a flow path of the fluid.

17 Claims, 23 Drawing Sheets

(56) References Cited

U.S. PATENT DOCUMENTS

| | | | | |
|---|---|---|---|---|
| 2012/0103067 | A1* | 5/2012 | Takahashi | G01N 25/32 73/25.05 |
| 2016/0195483 | A1* | 7/2016 | Reitmeier | G01N 33/0047 422/83 |
| 2019/0100851 | A1 | 4/2019 | Choa et al. | |
| 2020/0020842 | A1 | 1/2020 | Ishida et al. | |
| 2020/0052178 | A1 | 2/2020 | Shibata et al. | |
| 2020/0194651 | A1 | 6/2020 | Iwasaki et al. | |
| 2020/0212282 | A1* | 7/2020 | Nakatsuji | H10N 15/00 |

FOREIGN PATENT DOCUMENTS

| | | | | |
|---|---|---|---|---|
| JP | 2005098845 | A | * | 4/2005 |
| JP | 2006201100 | A | * | 8/2006 |
| JP | 2007255960 | A | * | 10/2007 |
| JP | 2020-25047 | A | | 2/2020 |
| WO | 2012/049790 | A1 | | 4/2012 |
| WO | 2016/181777 | A1 | | 11/2016 |
| WO | 2018/105601 | A1 | | 6/2018 |
| WO | WO-2018147101 | A1 | * | 8/2018 |
| WO | 2018/173853 | A1 | | 9/2018 |
| WO | WO-2019009308 | A1 | * | 1/2019 ............ H01L 35/04 |
| WO | 2020/218613 | A1 | | 10/2020 |

OTHER PUBLICATIONS

Yamada, JP2006201100A, Machine Translation (Year: 2006).*
Shin, JP2007-255960, Machine Translation (Year: 2007).*
Hattori, WO 2018147101 A1, Machine Translation (Year: 2018).*
International Search Report dated May 17, 2022, issued in counterpart International Application No. PCT/JP2022/006500. (3 pages).
Office Action dated Sep. 9, 2025, issued in counterpart JP Application No. 2023-500935, with English translation. (15 pages).

* cited by examiner

THERMOELECTRIC DEVICE

TECHNICAL FIELD

The present invention relates to a thermoelectric device.

BACKGROUND ART

The Seebeck effect is known as a thermoelectric mechanism in which a voltage is generated when a temperature gradient is applied to a substance (see Patent Literature 1, for example). Thermometers formed with thermocouples using the Seebeck effect, and Peltier elements for temperature control and cooling of various devices have already been put into practical use. Further, various configurations have been suggested for gas sensors in which heat generated by a catalyst from a gas to be detected is measured with a combination of the Seebeck effect and the catalyst (see Patent Literature 2).

CITATION LIST

Patent Literatures

Patent Literature 1: JP 2003-156461 A
Patent Literature 2: WO 2016/181777 A

SUMMARY OF INVENTION

Technical Problem

With the Seebeck effect, however, a voltage is generated in the same direction as the temperature gradient. Therefore, it is necessary to manufacture a structure in which p-type modules and n-type modules are alternately provided in a vertical direction from the heat source surface. For this reason, miniaturization is difficult, the degree of freedom in device design is limited, a complicated structure is obtained, and the manufacturing costs are high.

The present invention has been made in view of the above problems, and aims to provide a thermoelectric device that can be made smaller in size with a simple configuration.

Solution to Problem

A thermoelectric device according to an embodiment of the present invention includes: a sheet-like or plate-like thermoelectric conversion film including a thermoelectric conversion element formed with a material that exhibits an anomalous Nernst effect; and a high thermal conductive insulating film that is provided on at least a first surface of the thermoelectric conversion film, and is formed with an insulator having a higher thermal conductivity than the material of the thermoelectric conversion element.

Advantageous Effects of Invention

According to the present invention, a thermoelectric device can be made smaller in size with a simple configuration.

DESCRIPTION OF EMBODIMENTS

Figure 1:
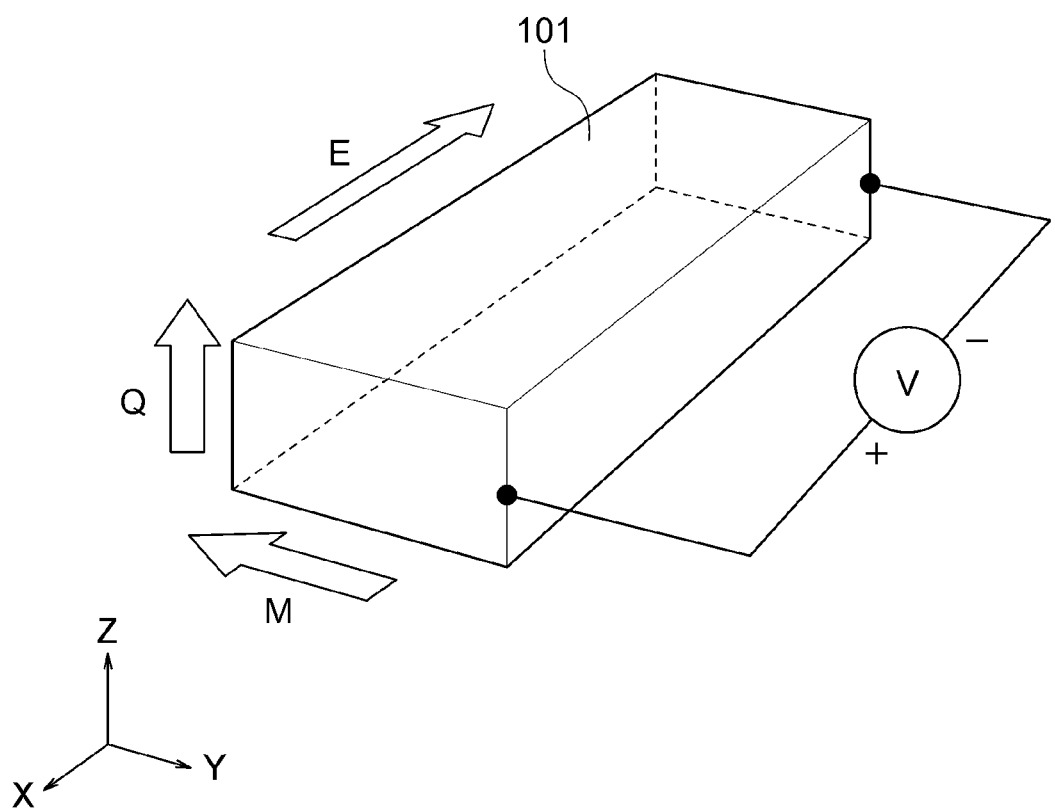
FIG. 1 is a schematic diagram for explaining the thermoelectric mechanism of a thermoelectric conversion film according to an embodiment.

The following is a description of an embodiment of the present invention, with reference to the accompanying drawings. In the embodiment described below, the same or similar components are denoted by the same reference numerals throughout the drawings. The drawings are merely schematic, and the relationship between plane dimension and thickness, and the ratio of the thickness of each component differ from the actual ones. Furthermore, it is needless to say that portions having different dimensional relationships and ratios are included in the drawings.

First, a thermoelectric conversion element and its thermoelectric mechanism according to an embodiment of the present invention are described with reference to FIG. 1.

(Configuration of a Thermoelectric Conversion Element)

A thermoelectric conversion element 101 according to this embodiment is formed with a material that exhibits the anomalous Nernst effect. As illustrated in FIG. 1, the thermoelectric conversion element 101 has the shape of a rectangular parallelepiped extending in one direction (the X direction), has a predetermined thickness (the length in the Z direction), and is magnetized in the −Y direction. When a heat flow Q ($\propto \nabla T$) in the +Z direction flows in the thermoelectric conversion element 101, a temperature difference is generated in the +Z direction. As a result, in the thermoelectric conversion element 101, an electromotive force E ($\propto M \times \nabla T$) is generated in the direction of an outer product orthogonal to both the direction of the heat flow Q (the +Z direction) and the direction of magnetization M (the −Y direction) by the anomalous Nernst effect. Specifically, depending on the Nernst coefficient of the material of the thermoelectric conversion element 101, the electromotive force E that causes a current to flow in the +X direction or the −X direction flows is generated.

Examples of the material that forms the thermoelectric conversion element 101 and exhibits the anomalous Nernst effect include Fe—Ga alloys such as $Fe_3Ga$, Fe—Al alloys such as $Fe_3Al$, $Co_2MnGa$, Fe—Ni alloys, Mn Sn, and $Mn_3Ge$.

(Configuration of a Thermoelectric Device)

Next, a thermoelectric device obtained by modularizing the thermoelectric conversion element 101 of this embodiment is described.

Figure 2A:
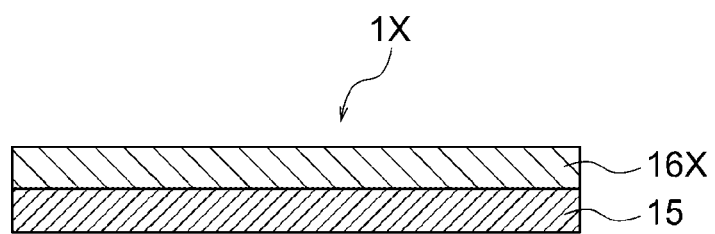
FIG. 2A is a cross-sectional view of the relevant portions of an example of a thermoelectric device according to this embodiment.

FIG. 2A shows a cross-sectional view of the relevant portions of an example of a thermoelectric device according to this embodiment. A thermoelectric device 1X includes a thermoelectric conversion film 15, and a high thermal conductive insulating film 16X provided on a first surface of thermoelectric conversion film 15. The thermoelectric conversion film 15 is a sheet-like or plate-like film that includes a thermoelectric conversion element formed with a material exhibiting the anomalous Nernst effect illustrated in FIG. 1. The high thermal conductive insulating film 16X is formed with an insulator having a higher thermal conductivity than that of the material of the thermoelectric conversion element of the thermoelectric conversion film 15.

Figure 2B:
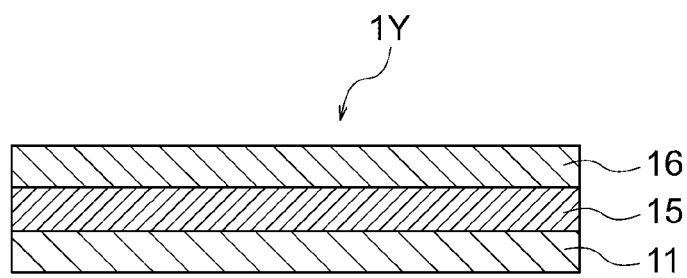
FIG. 2B is a cross-sectional view of the relevant portions of another example of a thermoelectric device according to this embodiment.

FIG. 2B shows a cross-sectional view of the relevant portions of another example of a thermoelectric device according to this embodiment. A thermoelectric device 1Y includes a thermoelectric conversion film 15, a first high thermal conductive insulating film 16 provided on a first surface of thermoelectric conversion film 15, and a second high thermal conductive insulating film 11 provided on a second surface on the opposite side from the first surface of the thermoelectric conversion film 15. The thermoelectric conversion film 15 is a sheet-like or plate-like film that includes a thermoelectric conversion element formed with a material exhibiting the anomalous Nernst effect as illustrated in FIG. 1. The first high thermal conductive insulating film 16 and the second high thermal conductive insulating film 11 are formed with an insulator having a higher thermal conductivity than that of the material of the thermoelectric conversion element of the thermoelectric conversion film 15.

The material of the high thermal conductive insulating film 16X in FIG. 2A, and the first high thermal conductive insulating film 16 and the second high thermal conductive insulating film 11 in FIG. 2B is SiC, AlN, SiN, BN, or the like, for example.

Alternatively, the material of the high thermal conductive insulating film 16X in FIG. 2A, and the first high thermal conductive insulating film 16 and the second high thermal conductive insulating film 11 in FIG. 2B is $Al_2O_3$, MgO, or the like, for example.

Where it is assumed that the length in the longitudinal direction of the thermoelectric conversion element 101 having the shape of a rectangular parallelepiped illustrated in FIG. 1 is L, and the thickness is H, the electromotive force generated by the anomalous Nernst effect is proportional to L/H when the temperature difference between the upper surface and the lower surface of the thermoelectric conversion element 101 is constant. That is, the longer and thinner the thermoelectric conversion element 101 forming the thermoelectric conversion film 15, the greater the electromotive force to be generated. As a result, not only can the performance of the thermoelectric device be enhanced, but a reduction in thickness and a reduction in size can also be achieved. Furthermore, heat is uniformly and efficiently conducted by the high thermal conductive insulating film provided on the thermoelectric conversion film, so that the performance of the thermoelectric device can be further improved.

It is known that a material exhibiting the anomalous Nernst effect also exhibits the Ettingshausen effect, which is an inverse process of the anomalous Nernst effect. Also, in the thermoelectric device utilizing the Ettingshausen effect, it is possible to reduce the thickness and the size of the thermoelectric device, and furthermore, it is possible to efficiently transport heat via the high thermal conductive insulating film. Thus, performance of the thermoelectric device can be enhanced.

In the description below, examples in which the thermoelectric device according to this embodiment is applied to a fluid sensor that detects fluid, examples in which the thermoelectric device is applied to a cooling device, and examples in which the thermoelectric device is applied to a heat flow sensor are explained. As a fluid sensor, a gas sensor that detects gas is described, but the fluid to be detected may be liquid.

First, an example in which the thermoelectric device according to this embodiment is applied to a gas sensor is described.

Example 1

Figure 3:
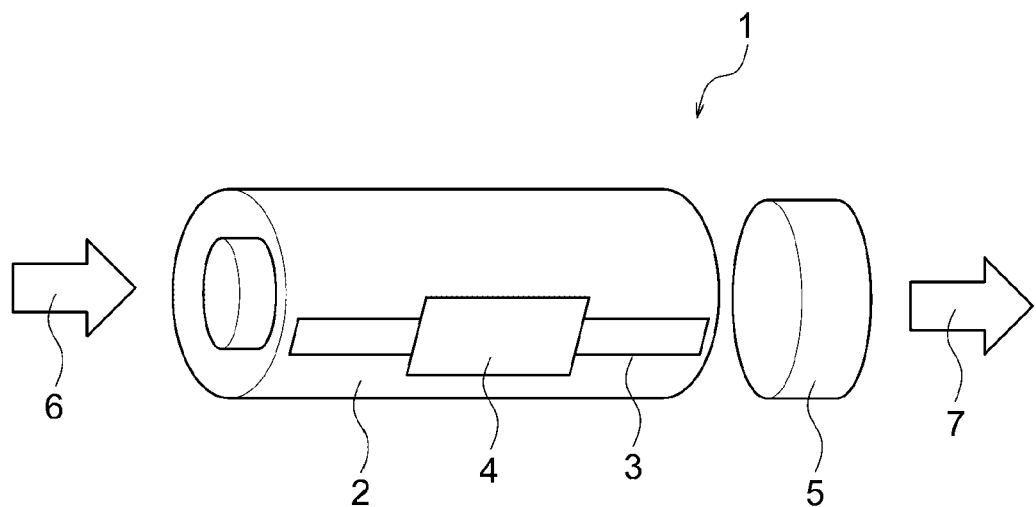
FIG. 3 is a perspective view illustrating the configuration of a gas sensor according to Example 1.

FIG. 3 schematically illustrates the configuration of a gas sensor according to Example 1. A gas sensor 1 includes a sensor unit 2 having a substantially cylindrical shape, a power-supply signal processing unit 4 that is provided on the outer peripheral surface of the sensor unit 2 and has a readout circuit (described later), a wiring line 3 that connects the sensor unit 2 and the power-supply signal processing unit 4, and a fan 5. Both ends of the sensor unit 2 are open. One opening end side serves as a gas intake path 6, and the other opening end side serves as a gas exhaust path 7.

The gas sensor 1 is designed so that the gas outside the sensor unit 2 is introduced into the sensor unit 2 through the intake path 6 by an operation of the fan 5, passes through the sensor unit 2, and is then discharged to the outside of the sensor unit 2 through the exhaust path 7. Although the fan 5 is provided on the side of the exhaust path 7 in FIG. 3, the fan 5 may be provided on the side of the intake path 6.

Figure 4:
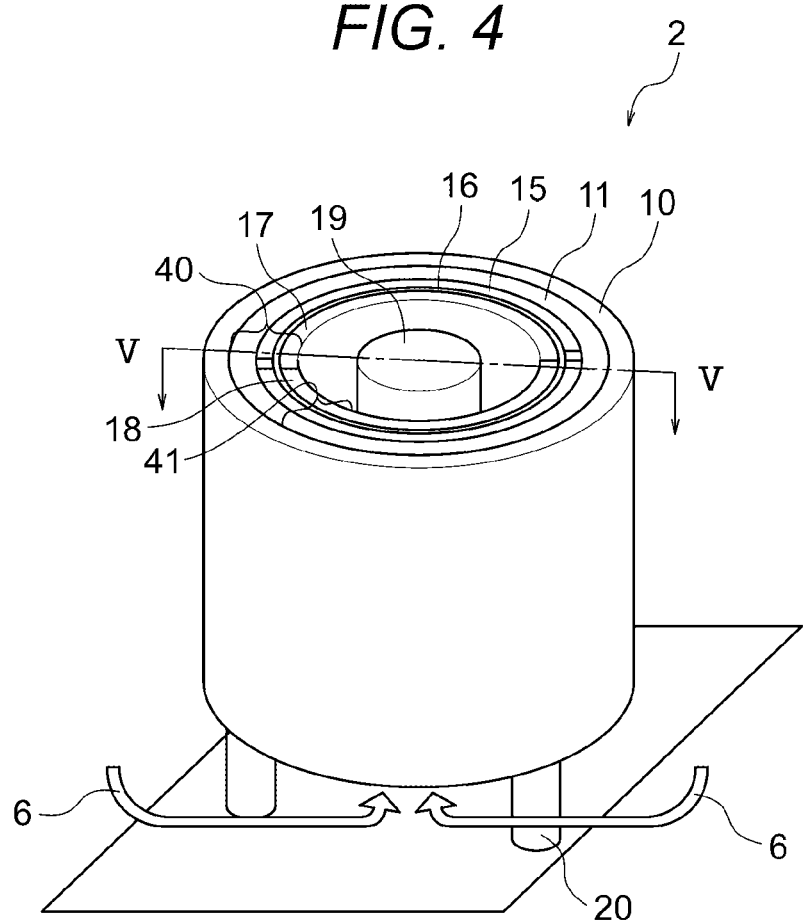
FIG. 4 is a perspective view illustrating the configuration of the sensor unit of the gas sensor according to Example 1.

FIG. 4 schematically illustrates the configuration of the sensor unit 2 of the gas sensor according to Example 1. The thermoelectric conversion film 15 is provided on the inner peripheral side of a heat insulating substrate 10. The first high thermal conductive insulating film 16 is provided on the first surface on the inner peripheral side of the thermoelectric conversion film 15. The second high thermal conductive insulating film 11 is provided between the second surface on the opposite side of the thermoelectric conversion film 15 from the first surface, and the heat insulating substrate 10. The inner peripheral surface of the first high thermal conductive insulating film 16 is partitioned into two regions having the same areas at a position intersecting a plane passing through the central axis of the cylindrical shape. A catalyst portion 17 is provided in one region, and a non-catalyst portion 18 that does not exhibit any catalytic action with respect to the gas to be detected is provided in the other region. The non-catalyst portion 18 is formed with a material obtained by removing the catalyst from the catalyst portion 17. The non-catalyst portion 18 is not necessarily formed, and the surface of the first high thermal conductive insulating film 16 may be in an exposed state. The inner peripheral sides of the catalyst portion 17 and the non-catalyst portion 18 are hollow, and form a gas flow path. A cylindrical heater 19 is provided at the center of this hollow portion.

The second high thermal conductive insulating film 11, the thermoelectric conversion film 15, the first high thermal conductive insulating film 16, and the catalyst portion 17 constitute a sensor structure 40, and the second high thermal conductive insulating film 11, the thermoelectric conversion film 15, the first high thermal conductive insulating film 16, and the non-catalyst portion 18 constitute a sensor structure 41.

The sensor unit 2 has leg portions 20, and is installed in a posture in which the open end surface is parallel to the floor surface at the location of installation of the gas sensor 1. The leg portions 20 provide a gap between the lower surface and the floor surface so as not to block the opening in the lower surface. For example, the leg portions 20 are designed so that the gas outside the sensor unit 2 is sucked into the sensor unit 2 from the lower surface side through the intake path 6, passes through the sensor unit 2, and is then discharged to the outside of the sensor unit 2. The leg portions 20 are designed so that an upward airflow is generated in the sensor unit 2 because of a chimney effect. Thus, the efficiency of intake of gas into the sensor unit 2 can be enhanced. In the configuration illustrated in FIG. 4, the sensor unit 2 is installed in a posture in which the open end surface of the sensor unit 2 is parallel to the floor surface of the installation location of the gas sensor 1. However, in some other configuration, the sensor unit 2 may be installed in a posture in which the open end surface is perpendicular to the floor surface of the installation location of the gas sensor 1.

Figure 5:
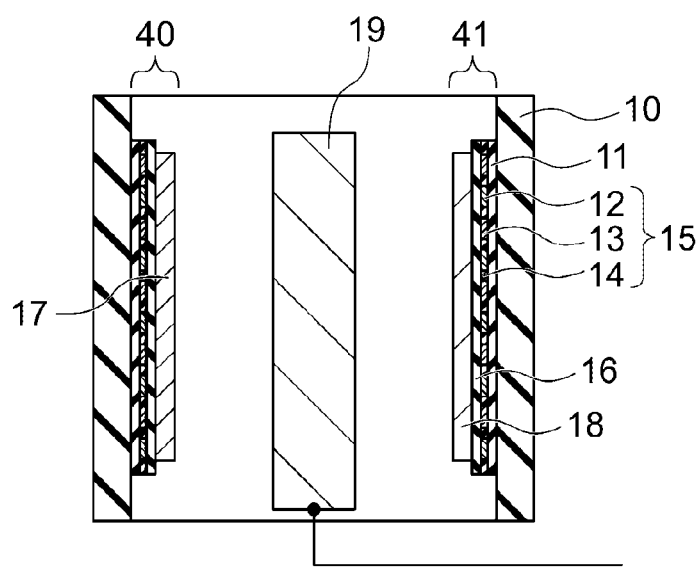
FIG. 5 is a cross-sectional view of the sensor unit of the gas sensor according to Example 1.

FIG. 5 is a cross-sectional view taken along line V-V defined in FIG. 4. The thermoelectric conversion film 15 is formed with first thermoelectric conversion elements 12 and second thermoelectric conversion elements 13 that extend in a direction parallel to the circumference of the cylindrical sensor unit 2 and are insulated from each other by low thermal conductive insulating films 14 serving as interlayer insulating films are alternately arranged in a direction perpendicular to the circumferential direction.

The first thermoelectric conversion elements 12 and the second thermoelectric conversion elements 13 are formed with materials that exhibit the anomalous Nernst effect. The first high thermal conductive insulating film 16 and the second high thermal conductive insulating film 11 are formed with an insulator that has a higher thermal conductivity than the materials of the first thermoelectric conversion elements 12 and the second thermoelectric conversion elements 13. The low thermal conductive insulating films 14 are formed with an insulator that has a lower thermal conductivity than the materials of the first thermoelectric conversion elements 12 and the second thermoelectric conversion elements 13, and, for example, is formed with insulating films such as porous silica films.

The catalyst portion 17 is formed with a film of the catalyst, or a film carrying the catalyst. The catalyst has characteristics to generate heat when reacting with the target gas to be detected by the gas sensor 1. For example, Pt is used as the catalyst. In a case where a catalyst is carried by a film, the catalyst is preferably carried by a film having a large surface area, and, for example, is carried by a porous film. The catalyst portion 17 is formed with, for example, a porous $Al_2O_3$ film carrying Pt.

The non-catalyst portion 18 is formed with a material obtained by removing the catalyst from the catalyst portion 17, and is formed with, for example, a porous $Al_2O_3$ film not carrying Pt.

The heater 19 is connected to the power-supply signal processing unit 4 via the wiring line 3, and is formed with a material that generates heat when energized.

Figure 6A:
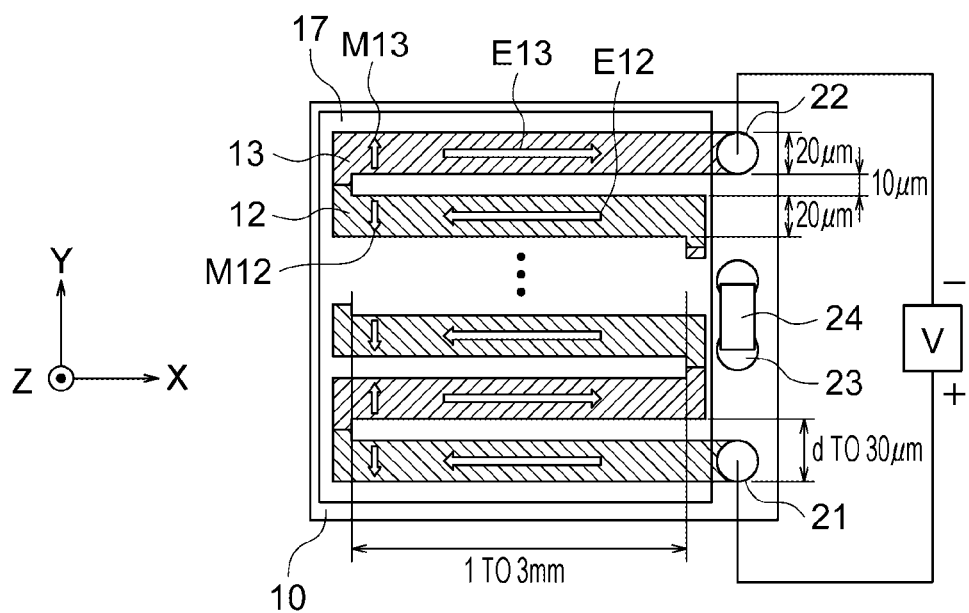
FIG. 6A is a diagram illustrating the layout in a portion of a thermoelectric conversion film of the gas sensor according to Example 1.

FIG. 6A illustrates the layout (a development view) in the region of the catalyst portion 17 of the thermoelectric conversion film 15 of the gas sensor 1 according to Example 1.

A plurality of the first thermoelectric conversion elements 12 and a plurality of the second thermoelectric conversion elements 13 are provided, and each have a three-dimensional L-shape. The first thermoelectric conversion elements 12 and the second thermoelectric conversion elements 13 are alternately arranged in parallel in a direction perpendicular to the longitudinal direction (the X direction). Here, the side portion in the vicinity of one end portion (the −X direction) in the longitudinal direction of a first thermoelectric conversion element 12 is connected to the side portion of the second thermoelectric conversion element 13 adjacent to one side (the +Y direction), and the side portion in the vicinity of the other end portion (the +X direction) in the longitudinal direction of each first thermoelectric conversion element 12 is connected to the side portion of the second thermoelectric conversion element 13 adjacent to the other side (the −Y direction). The side portion in the vicinity of one end portion (the −X direction) in the longitudinal direction of a second thermoelectric conversion element 13 is connected to the side portion of the first thermoelectric conversion element 12 adjacent to the other side (the −Y direction), and the side portion in the vicinity of the other end portion (the +X direction) in the longitudinal direction of the second thermoelectric conversion element 13 is connected to the side portion of the first thermoelectric conversion element 12 adjacent to the one side (the +Y direction). The first thermoelectric conversion elements 12 and the second thermoelectric conversion elements 13 are insulated from each other, except for the connecting portions.

Figure 6B:
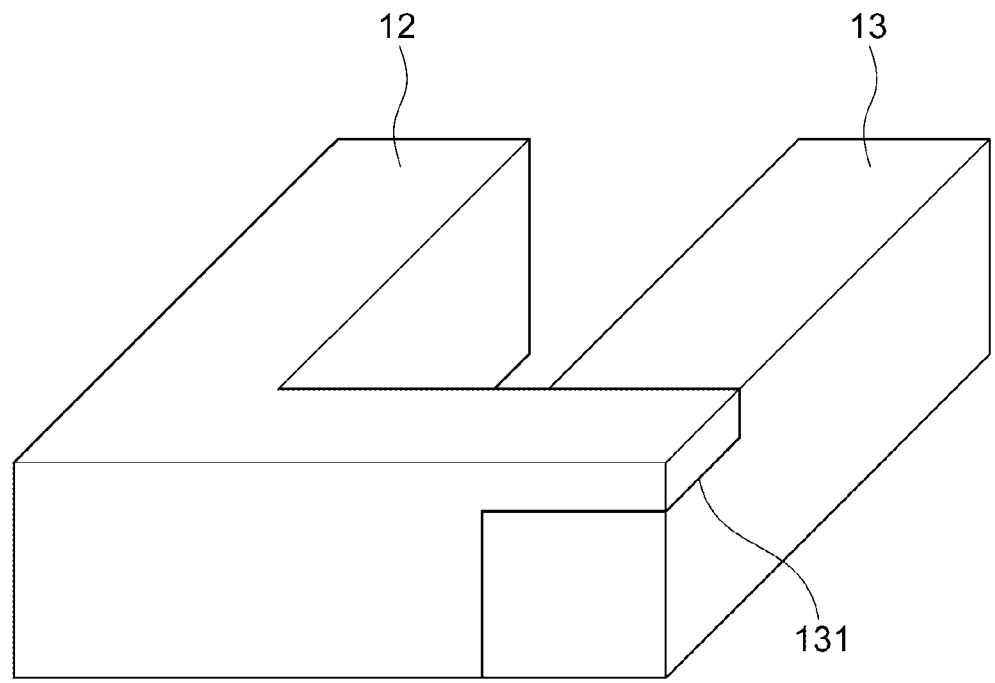
FIG. 6B is a schematic diagram illustrating an example of the connecting portion between adjacent thermoelectric conversion elements.

Note that the connection between adjacent thermoelectric conversion elements is not limited to the example illustrated in FIG. 6A. For example, a step may be formed by etching an upper surface end portion of a thermoelectric conversion element, and an end portion of an adjacent thermoelectric conversion element may be connected thereto so as to fill the step region (a 20 μm×20 μm×10 nm region, for example). FIG. 6B illustrates an example in which an end portion of a first thermoelectric conversion element 12 is connected to a step region 131 at an end portion of the upper surface of a second thermoelectric conversion element 13.

In this manner, the plurality of first thermoelectric conversion elements 12 and the plurality of second thermoelectric conversion elements 13 are electrically connected in series, and are provided in a meandering shape. The end portions of the first thermoelectric conversion element 12 and the second thermoelectric conversion element 13 that are located at the outermost positions and are not connected to any first thermoelectric conversion element 12 and any second thermoelectric conversion element 13 serve as terminals of a power generator formed with the plurality of first thermoelectric conversion elements 12 and the plurality of second thermoelectric conversion elements 13 connected in series. The catalyst portion 17 is formed in a region covering the first thermoelectric conversion elements 12 and the second thermoelectric conversion elements 13. Here, the first thermoelectric conversion elements 12 are magnetized in the −Y direction (the direction of magnetization M12). Meanwhile, the second thermoelectric conversion elements 13 are magnetized in the +Y direction (the direction of magnetization M13). Note that the number of the first thermoelectric conversion elements 12 and the number of the second thermoelectric conversion elements 13 are not limited. Further, the plurality of first thermoelectric conversion elements 12 and the plurality of second thermoelectric conversion elements 13 have Nernst coefficients of the same sign.

When the catalyst portion 17 generates heat by reacting with the gas flowing in the flow path, the heat is conducted from the catalyst portion 17 to the first surface of the thermoelectric conversion film 15 via the first high thermal conductive insulating film 16, a heat flow in the Z direction flows in the first thermoelectric conversion elements 12 and the second thermoelectric conversion elements 13. When a temperature difference is generated due to the heat flow, an electromotive force E12 is generated in a direction (the −X direction) orthogonal to both the direction of the magnetization M12 (the −Y direction) and the direction of the heat flow Q (the +Z direction) in the first thermoelectric conversion elements 12, due to the anomalous Nernst effect. In the second thermoelectric conversion element 13, an electromotive force E13 is generated in a direction (the +X direction) orthogonal to both the direction of the magnetization M13 (the +Y direction) and the direction of the heat flow Q (the +Z direction), due to the anomalous Nernst effect.

Here, the heat conducted to the first thermoelectric conversion elements 12 and the second thermoelectric conversion elements 13 includes the heat generated by the reaction with the gas of the catalyst portion 17 and heat from the non-catalyst portion 18 or from some other environment, and an electromotive force due to the anomalous Nernst effect is generated in the first thermoelectric conversion elements 12 and the second thermoelectric conversion elements 13 by the temperature difference generated between the first thermoelectric conversion elements 12 and the second thermoelectric conversion elements 13 by the sum of these kinds of heat. The electromotive force thus obtained is an output due to the heat generated by the catalyst portion 17 reacting with the gas and the heat of an environmental fluctuation.

As described above, the first thermoelectric conversion elements 12 and the second thermoelectric conversion elements 13 arranged in parallel are electrically connected in series. Accordingly, the electromotive force E12 generated by the first thermoelectric conversion elements 12 can be applied to the adjacent second thermoelectric conversion elements 13. Further, the electromotive force E12 generated by the first thermoelectric conversion elements 12 and the electromotive force E13 generated by the adjacent second thermoelectric conversion elements 13 are in opposite directions. Accordingly, the electromotive forces are added up in the respective adjacent first thermoelectric conversion elements 12 and second thermoelectric conversion elements 13, and an output voltage V can be increased. The first thermoelectric conversion elements 12 and the second thermoelectric conversion elements 13 are connected to the wiring line 3 illustrated in FIG. 3 via through holes 21 and 22 penetrating the heat insulating substrate 10, and the electromotive forces generated by the first thermoelectric conversion elements 12 and the second thermoelectric conversion elements 13 are detected by the power-supply signal processing unit 4.

The heater 19 is provided so as to face surfaces of the catalyst portion 17 and the non-catalyst portion 18, and can heat a region on the inner side of the heat insulating substrate 10 of the sensor unit 2 to a predetermined temperature. For example, the heater 19 is designed so as to heat a region on the inner side of the heat insulating substrate 10 of the sensor unit 2 to 100° C. When moisture adsorbs to the catalyst portion 17, the reactivity of the catalyst becomes lower. Thus, it is possible to prevent deterioration of the catalyst function by evaporating moisture through heating. Furthermore, it is possible to secure the stability of the characteristics of the gas sensor by controlling and adjusting the region on the inner side of the heat insulating substrate 10 of the sensor unit 2 to a constant temperature.

As shown in FIG. 6A, for example, a temperature sensor 24 is mounted on the heat insulating substrate 10 outside the region of the catalyst portion 17, and temperature can be detected at the power-supply signal processing unit 4 via a through hole 23. The mounting position of the temperature sensor 24 is not limited to any particular position, and may be formed in the region of the catalyst portion 17. In this case, the first thermoelectric conversion elements 12 and the second thermoelectric conversion elements 13 are laid out so as to avoid the mounting position of the temperature sensor 24.

Figure 7:
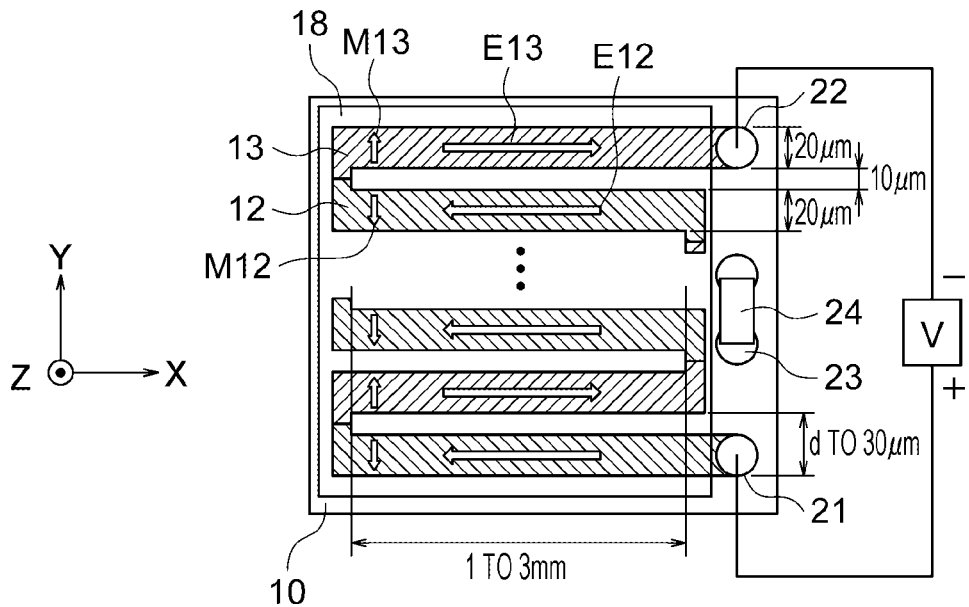
FIG. 7 is a diagram illustrating the layout in another portion of the thermoelectric conversion film of the gas sensor according to Example 1.

FIG. 7 illustrates the layout (a development view) in the region of the non-catalyst portion 18 of the thermoelectric conversion film 15 of the gas sensor 1 according to Example 1. The configuration illustrated in FIG. 7 is substantially the same as the configuration illustrated in FIG. 6A, except that the non-catalyst portion 18 is provided in place of the catalyst portion 17 in FIG. 6A. It should go without saying that the connection between thermoelectric conversion elements illustrated in FIG. 6B can also be adopted in FIG. 7.

In the non-catalyst portion 18, there is no heat generation caused by a reaction with the gas flowing in the flow path, but heat from the non-catalyst portion 18 or heat from some other environment is conducted to the thermoelectric conversion film 15. The electromotive force E12 is then generated in the first thermoelectric conversion elements 12, and the electromotive force E13 is generated in the second thermoelectric conversion elements 13. The electromotive forces are added up in the respective adjacent first thermoelectric conversion elements 12 and second thermoelectric conversion elements 13, and the resultant voltage is output as the output voltage V. The electromotive forces of the first thermoelectric conversion elements 12 and the second thermoelectric conversion elements 13 thus obtained are outputs due to environmental fluctuations.

The thickness of the heat insulating substrate 10 is 25 µm to 1 mm, and is, for example, 100 µm. The thickness of the second high thermal conductive insulating film 11 is 10 nm to 1 µm, and is, for example, 0.1 µm. The thickness of the thermoelectric conversion film 15 is 10 nm to 10 µm, and is, for example, 0.1 µm. The thickness of the first high thermal conductive insulating film 16 is 10 nm to 1 µm, and is, for example, 0.1 µm. The thickness of the catalyst portion 17 is 5 nm to 10 µm, and is, for example, 5 µm.

As illustrated in FIGS. 6A and 7, the length of the first thermoelectric conversion elements 12 and the second thermoelectric conversion elements 13 in the X direction is 1 mm to 100 mm, and is, for example, 1 mm to 3 mm. The width of the first thermoelectric conversion elements 12 and the second thermoelectric conversion elements 13 in the Y direction is 0.1 µm to 100 µm, and is, for example, 20 µm. The interval between a first thermoelectric conversion element 12 and a second thermoelectric conversion element 13 in the Y direction, which is the width of a low thermal conductive insulating film 14 in the Y direction, are 0.1 µm to 100 µm, and is, for example, 10 µm. The repetition width d of the first thermoelectric conversion elements 12 and the second thermoelectric conversion elements 13 in the Y direction (the sum of the width of a first thermoelectric conversion element 12 or a second thermoelectric conversion element 13 in Y direction and the interval between a first thermoelectric conversion element 12 and a second thermoelectric conversion element 13) is 0.1 µm to 100 µm, and is, for example, 30 µm.

In the gas sensor 1, it is preferable that the temperature of the region on the inner side of the heat insulating substrate 10 can be heated from 25° C. to 100° C. in a short time within 1 s by heating the heater 19 with power consumption as low as about 50 mW. For this purpose, it is important to reduce the total volume Vd of the second high thermal conductive insulating film 11, the thermoelectric conversion film 15, the first high thermal conductive insulating film 16, the catalyst portion 17, and the non-catalyst portion 18 in the region on the inner side of the heat insulating substrate 10. The condition for the volume Vd when t(s) represents the rise time from 25° C. to 100° C. is represented and P(W) represents the power consumption by the heater 19 is expressed by Expression (1).

[Math. 1]

$$V_d < \frac{Pt}{0.187} \text{mm}^3 \tag{1}$$

When the rise time from 25° C. to 100° C. is 1 s, and the power consumption by the heater 19 is 50 mW, the condition for Vd is Vd<0.27 mm³.

In Example 1, the ratio of the heat capacity of the catalyst portion 17 formed with Pt to the total heat capacity of the thermoelectric conversion film 15, the first high thermal conductive insulating film 16, the second high thermal conductive insulating film 11, and the catalyst portion 17 is 95%, the ratio of the heat capacity of the second high thermal conductive insulating film 11 formed with AlN is 1.6%, the ratio of the heat capacity of the thermoelectric conversion film 15 is 1.8%, and the ratio of the heat capacity of the first high thermal conductive insulating film 16 formed with AlN is 1.6%. Note that the ratio of the heat capacity of each of the films constituting the sensor unit is not limited to any particular value.

Figure 8:
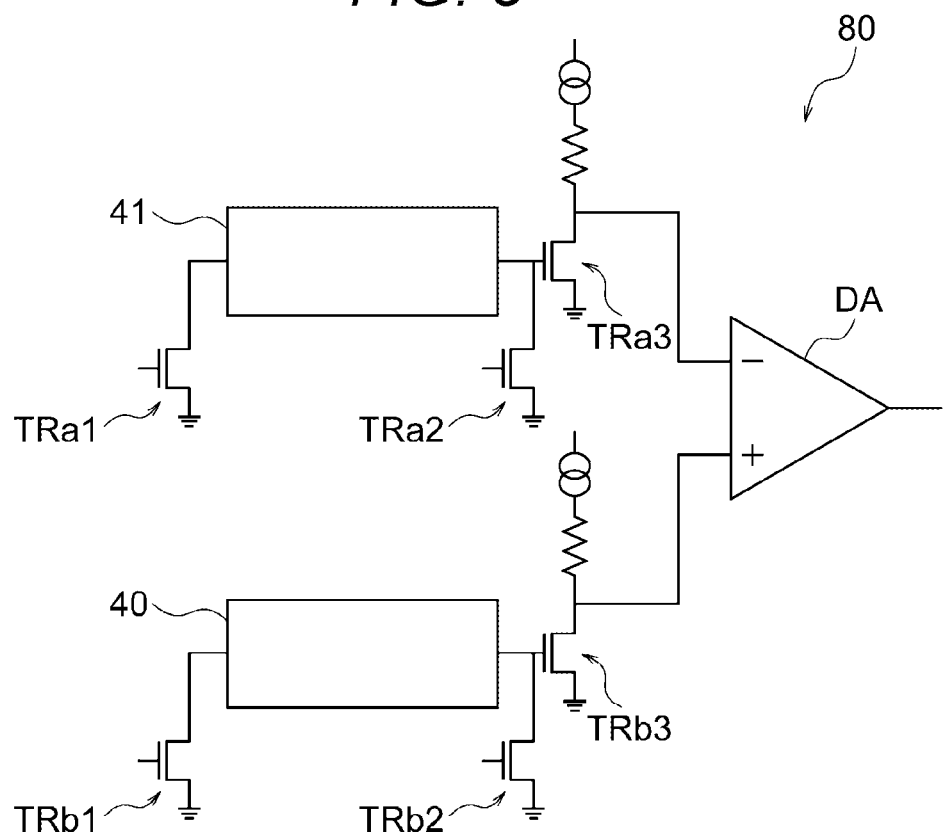
FIG. 8 is a diagram illustrating a readout circuit of the gas sensor according to Example 1.

FIG. 8 illustrates the configuration of a readout circuit 80 of the gas sensor 1 according to Example 1. The readout circuit 80 is provided in the power-supply signal processing unit 4. The source of a transistor TRa1 is connected to one terminal of the thermoelectric conversion film 15 of the sensor structure 41, and the source of a transistor TRa2 and the gate of the transistor TRa3 are connected to the other terminal. The transistor TRa3 is a source follower amplifier that amplifies an output from the sensor structure 41. The transistor TRa1 and the transistor TRa2 are reset transistors. An output of the sensor structure 41 is input to the (−) side of a differential amplifier DA.

The source of a transistor TRb1 is connected to one terminal of the thermoelectric conversion film 15 of the sensor structure 40, and the source of a transistor TRb2 and the gate of the transistor TRb3 are connected to the other terminal. The transistor TRb3 is a source follower amplifier that amplifies an output from the sensor structure 40. The transistor TRb1 and the transistor TRb2 are reset transistors. An output of the sensor structure 40 is input to the (+) side of the differential amplifier DA.

Note that, in the readout circuit 80, an emitter follower amplifier may be used in place of the source follower amplifier.

Next, an operation of the readout circuit 80 is described. First, before readout, the transistor TRa1, the transistor TRa2, the transistor TRb1, and the transistor TRb2, which are reset transistors, are turned on and left for a predetermined time (a CR time constant), to reset the potentials of the sensor structure 41 and the sensor structure 40 to a predetermined potential.

At the start of measurement, each reset transistor is turned off, and the output of the sensor structure 41 corresponding to an environmental fluctuation output is amplified by the transistor TRa3, and is input to the (−) side of the differential amplifier DA. On the other hand, the output of the sensor structure 40 corresponding to an output of the sum of heat generation at the catalyst portion 17 and heat of an environmental fluctuation is amplified by the transistor TRb3, and is input to the (+) side of the differential amplifier DA.

Next, the differential amplifier DA amplifies the difference between the output from the sensor structure 41 and the output from the sensor structure 40, and the output of the gas sensor 1 is read from the differential amplifier DA.

As described above, background noise is removed by subtracting the output signal of the region of the non-catalyst portion 18 from the output signal of the region of the catalyst portion 17 in the above manner, and thus, the S/N ratio of the gas sensor output can be increased.

Note that the readout circuit 80 illustrated in FIG. 8 is also applicable to the gas sensor including a catalyst portion and a non-catalyst portion as illustrated in each of the examples described below.

Figure 9:
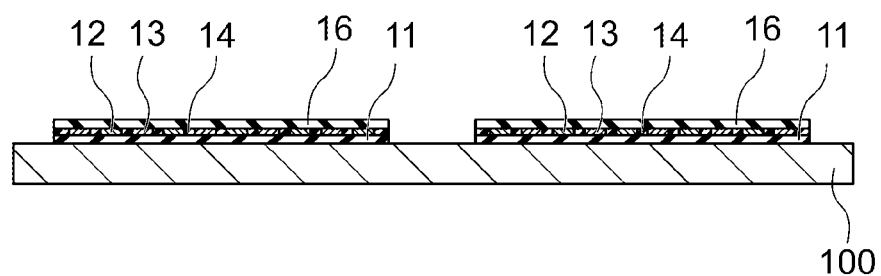
FIG. 9 is a cross-sectional view for explaining a method for manufacturing the gas sensor according to Example 1.

Next, referring to FIG. 9, a method for manufacturing the gas sensor 1 is described. First, a release layer formed with a deliquescent substance such as MgO is formed on a transfer substrate 100, and, for example, a 0.1-μm thick AlN film is then formed by a sputtering method, to form the first high thermal conductive insulating film 16. Next, a resist film that is open in the regions of the first thermoelectric conversion elements 12 and the second thermoelectric conversion elements 13 is formed on the first high thermal conductive insulating film 16 by application of a resist film and a photolithography process, a 0.1-μm thick film of a material exhibiting the anomalous Nernst effect is formed by a sputtering method, for example, and the first thermoelectric conversion elements 12 and the second thermoelectric conversion elements 13 in a predetermined pattern are formed by a lift-off technique for removing the resist film and the material exhibiting the anomalous Nernst effect formed on the resist film.

Subsequently, a porous insulating film having a film thickness of 0.1 μm is formed in regions between the first thermoelectric conversion elements 12 and the second thermoelectric conversion elements 13 by, for example, a plasma enhanced chemical vapor deposition (CVD) method or a spin coating method, and is polished by a chemical mechanical polishing (CMP) method until the upper surfaces of the first thermoelectric conversion elements 12 and the second thermoelectric conversion elements 13 are exposed, to form the low thermal conductive insulating films 14. Next, a 0.1-μm thick AlN film is formed on the first thermoelectric conversion elements 12, the second thermoelectric conversion elements 13, and the low thermal conductive insulating films 14 by, for example, a sputtering method, to form the second high thermal conductive insulating film 11. Each of the above layers may be formed by some other film forming method such as a molecular beam epitaxy (MBE) method, a vacuum vapor deposition method using resistance heating, or a thermal CVD method. Subsequently, the first thermoelectric conversion elements 12 and the second thermoelectric conversion elements 13 are magnetized in the predetermined directions illustrated in FIGS. 6A and 7.

Next, a stack of the second high thermal conductive insulating film 11, the first thermoelectric conversion elements 12, the second thermoelectric conversion elements 13, the low thermal conductive insulating films 14, and the first high thermal conductive insulating film 16 is peeled off at the interface with the release layer, and is transferred onto the outer peripheral surfaces of the catalyst portion 17 and the non-catalyst portion 18 processed beforehand into a cylindrical shape. By the transfer, the first high thermal conductive insulating film 16 is located on the inner peripheral side, and the second high thermal conductive insulating film 11 is located on the outer peripheral side. The heat insulating substrate 10 is bonded to the outer peripheral side of the second high thermal conductive insulating film 11.

Next, a through hole penetrating the heat insulating substrate 10 is formed, and the inside of the through hole is filled, to form the wiring line 3. Here, a temperature sensor may be mounted on the heat insulating substrate 10 at the position to be connected to the through hole, and the wiring line may be connected via the through hole. Subsequently, the power-supply signal processing unit 4 is connected to the wiring line 3. In the above manner, the gas sensor 1 illustrated in FIGS. 3 and 4 can be manufactured.

Example 2

Figure 10:
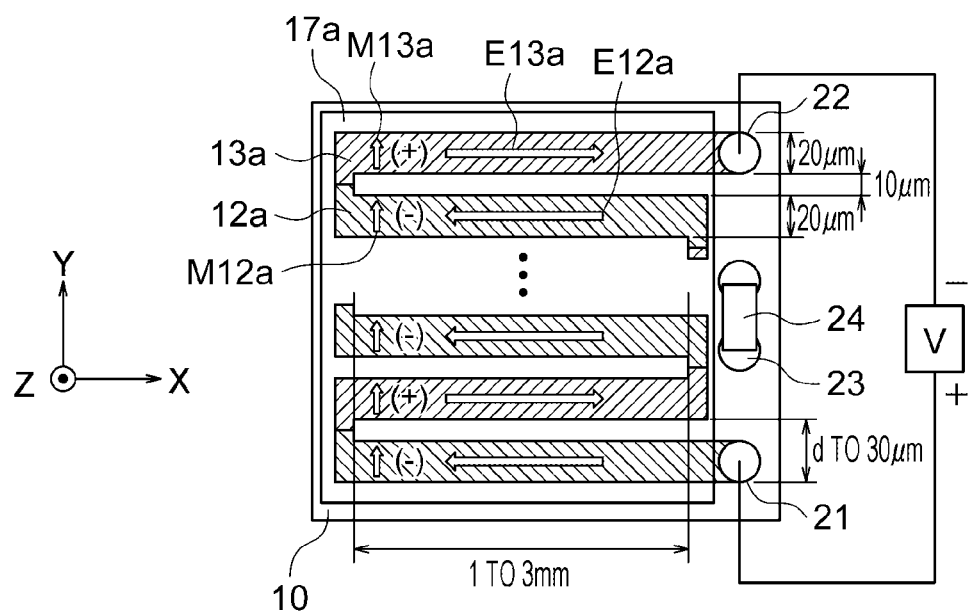
FIG. 10 is a diagram illustrating the layout in a portion of a thermoelectric conversion film of a gas sensor according to Example 2.

FIG. 10 illustrates the layout in the catalyst portion region of the thermoelectric conversion film of a gas sensor according to Example 2. In the thermoelectric conversion film according to Example 2, a plurality of first thermoelectric conversion elements 12a and a plurality of second thermoelectric conversion elements 13a are alternately arranged in parallel in a direction perpendicular to the longitudinal direction (the X direction), are electrically connected in series, and have a meandering shape, as in Example 1. Example 2 differs from Example 1 illustrated in FIG. 6A in that the first thermoelectric conversion elements 12a and the second thermoelectric conversion elements 13a have Nernst coefficients with signs different from each other and are magnetized in the same direction. In FIG. 10, the first thermoelectric conversion elements 12a have a Nernst coefficient with the sign (−), and the second thermoelectric conversion elements 13a have a Nernst coefficient with the sign (+). Further, the first thermoelectric conversion elements 12a and the second thermoelectric conversion elements 13a are both magnetized in the +Y direction (the direction of magnetization M12a and M13a).

A catalyst portion 17a is provided in a region covering the first thermoelectric conversion elements 12a and the second thermoelectric conversion elements 13a. When the catalyst portion 17a generates heat by reacting with the gas flowing in the flow path, an electromotive force E12a is generated in the −X direction in the first thermoelectric conversion elements 12a, and an electromotive force E13a is generated in the +X direction in the second thermoelectric conversion elements 13a, due to the anomalous Nernst effect. The electromotive forces are added up in the respective adjacent first thermoelectric conversion elements 12a and second thermoelectric conversion elements 13a, and the output voltage V can be increased.

Figure 11:
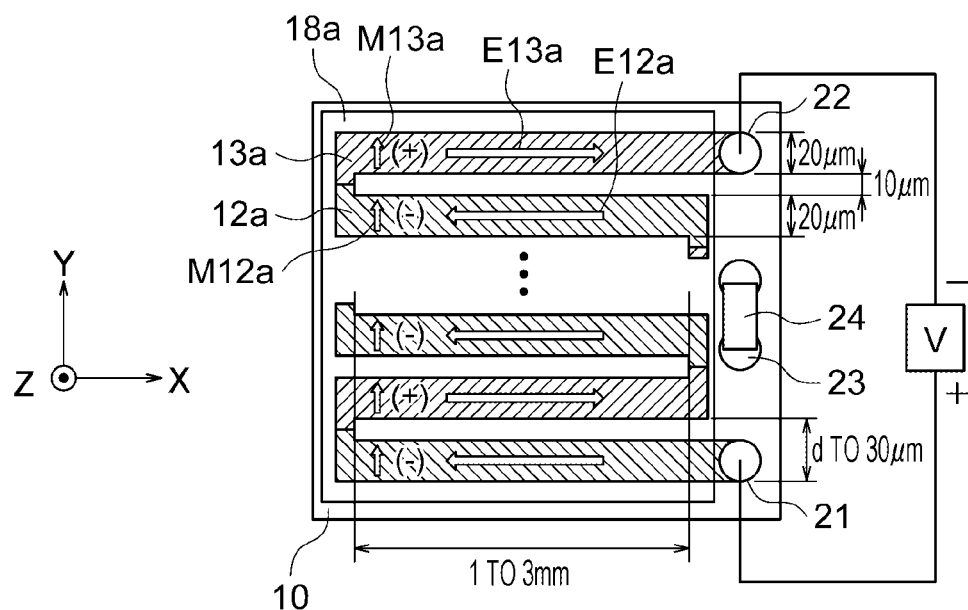
FIG. 11 is a diagram illustrating the layout in another portion of the thermoelectric conversion film of the gas sensor according to Example 2.

FIG. 11 illustrates the layout in the region of the non-catalyst portion of the thermoelectric conversion film of the gas sensor according to Example 2. The configuration illustrated in FIG. 11 is the same as the configuration illustrated in FIG. 10, except that a non-catalyst portion 18a is provided in place of the catalyst portion 17a in FIG. 10.

In the non-catalyst portion 18a, there is no heat generation caused by a reaction with the gas flowing in the flow path, but heat from the non-catalyst portion 18a or heat from some other environment is conducted to the thermoelectric conversion film. The electromotive force E12a is then generated in the first thermoelectric conversion elements 12a, and the electromotive force E13a is generated in the second thermoelectric conversion elements 13a. The electromotive forces are added up in the respective adjacent first thermoelectric conversion elements 12a and second thermoelectric conversion elements 13a, and the resultant voltage is output as the output voltage V.

Note that the connection between thermoelectric conversion elements illustrated in FIG. 6B can also be adopted in Example 2.

Example 3

Figure 12:
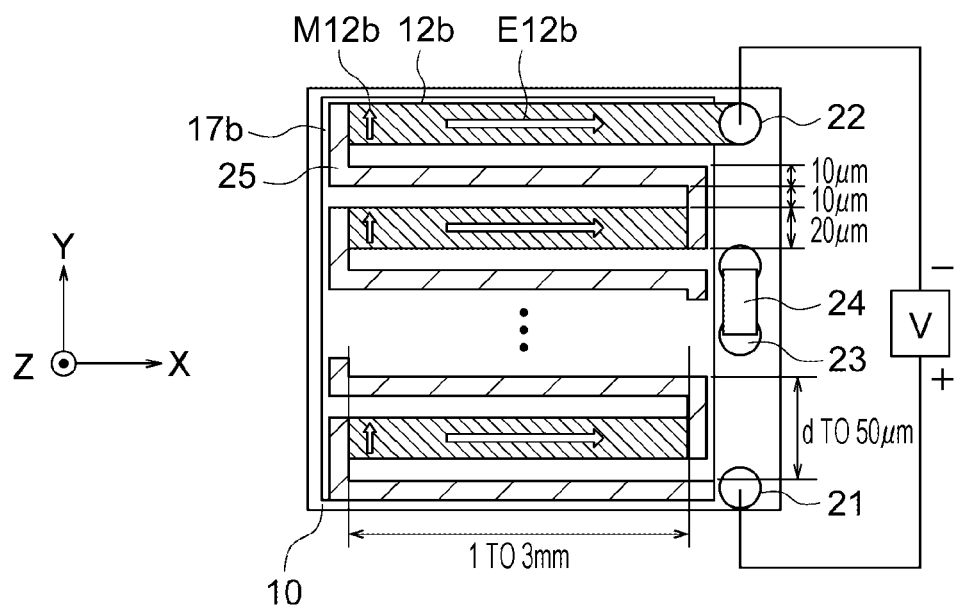
FIG. 12 is a diagram illustrating the layout in a portion of a thermoelectric conversion film of a gas sensor according to Example 3.

FIG. 12 illustrates the layout in the region of the catalyst portion of a thermoelectric conversion film of a gas sensor according to Example 3. In Example 3, a plurality of thermoelectric conversion elements 12b is arranged in parallel in a direction perpendicular to the longitudinal direction (the X direction), and wiring lines 25 are provided so that one end portion (the −X direction) of a thermoelectric conversion element 12b in the longitudinal direction is connected to the other end portion (the +X direction) of another thermoelectric conversion element 12b adjacent to one side (the −Y direction) in the longitudinal direction. The connection between the thermoelectric conversion elements 12b and the wiring lines 25 is similar to the connection between the adjacent thermoelectric conversion elements illustrated in FIG. 6B. A step region is formed at an end portion of the upper surface of a thermoelectric conversion element 12b, and an end portion of a wiring line 25 is connected so as to fill the step region. The thermoelectric conversion elements 12b and the wiring lines 25 are insulated from each other, except for the connecting portions. In this manner, the plurality of thermoelectric conversion elements 12b is electrically connected in series, and is provided in a meandering shape. The thermoelectric conversion elements 12b are magnetized in the +Y direction (the direction of magnetization M12b).

A catalyst portion 17b is provided in a region covering the thermoelectric conversion elements 12b. When the catalyst portion 17b generates heat by reacting with the gas flowing in the flow path, an electromotive force E12b is generated in the +X direction in the thermoelectric conversion elements 12b, due to the anomalous Nernst effect. The electromotive forces are added up in the respective adjacent thermoelectric conversion elements 12b, and the output voltage V can be increased.

Figure 13:
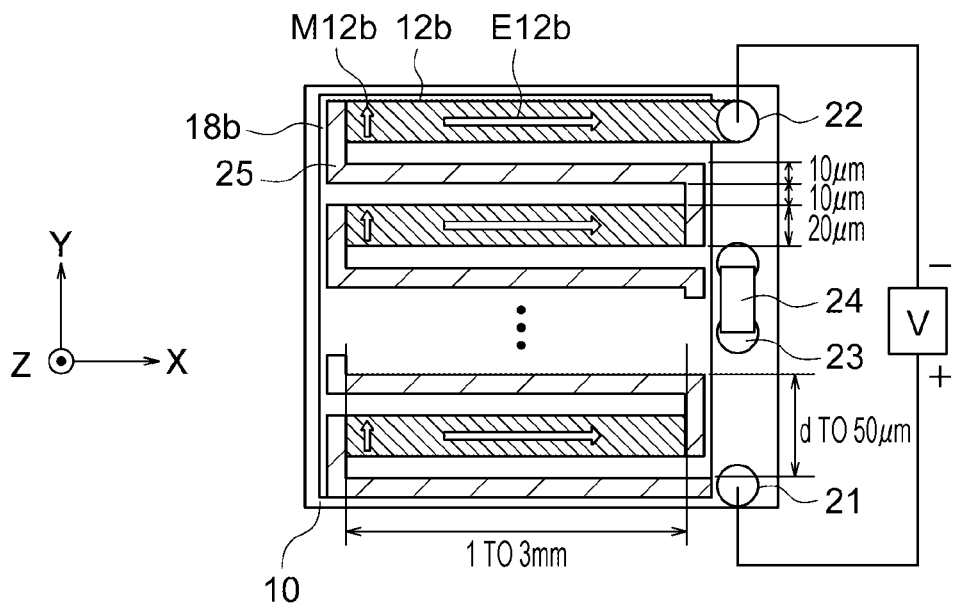
FIG. 13 is a diagram illustrating the layout in another portion of the thermoelectric conversion film of the gas sensor according to Example 3.

FIG. 13 illustrates the layout in the region of the non-catalyst portion of the thermoelectric conversion film of the gas sensor according to Example 3. The configuration illustrated in FIG. 13 is the same as the configuration illustrated in FIG. 12, except that a non-catalyst portion 18b is provided in place of the catalyst portion 17b illustrated in FIG. 12.

In the non-catalyst portion 18b, there is no heat generation caused by a reaction with the gas flowing in the flow path, but heat from the non-catalyst portion 18b or heat from some other environment is conducted to the thermoelectric conversion film, and the electromotive force E12b is then generated in the thermoelectric conversion elements 12b. The electromotive forces are added up in the respective adjacent thermoelectric conversion elements 12b, and the resultant voltage is output as a voltage V.

Example 4

Figure 14:
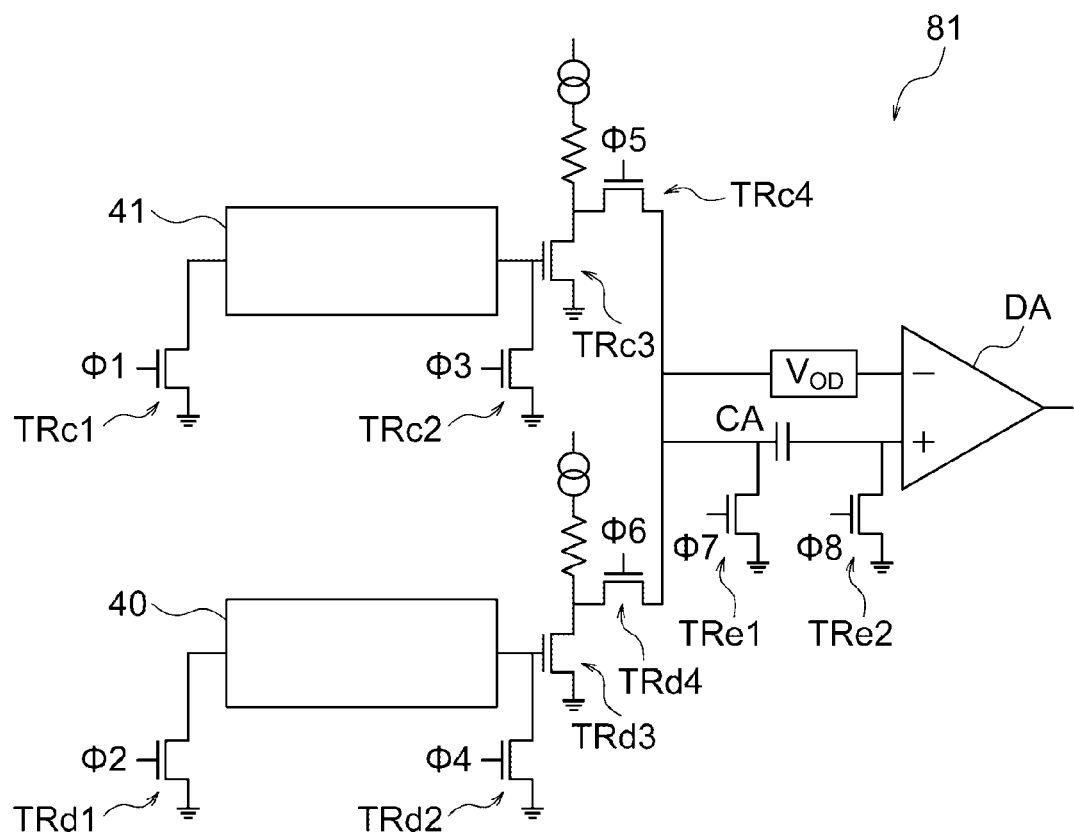
FIG. 14 is a diagram illustrating a readout circuit of a gas sensor according to Example 4.

Instead of the readout circuit 80 (FIG. 8) of the gas sensor 1 according to Example 1, a readout circuit 81 according to Example 4 illustrated in FIG. 14 can be used.

In the readout circuit 81, as illustrated in FIG. 14, the source of a transistor TRc1 is connected to one terminal of the thermoelectric conversion film of the sensor structure 41, and the source of a transistor TRc2 and the gate of the transistor TRc3 are connected to the other terminal. The transistor TRc3 is a source follower amplifier that amplifies an output from the sensor structure 41. The transistor TRc1 and the transistor TRc2 are reset transistors. The output of the sensor structure 41 is input to the (−) side of the differential amplifier DA via a transistor TRc4 and a $V_{OD}$ circuit (a voltage oscillator).

The source of a transistor TRd1 is connected to one terminal of the thermoelectric conversion film of the sensor structure 40, and the source of a transistor TRd2 and the gate of the transistor TRd3 are connected to the other terminal. The transistor TRd3 is a source follower amplifier that amplifies an output from the sensor structure 40. The transistor TRd1 and the transistor TRd2 are reset transistors. The output of the sensor structure 40 amplified by the transistor TRd3 is input to the (+) side of the differential amplifier DA via a transistor TRd4. A transistor TRe1, a clamp capacitive element CA, and a transistor TRe2 are connected between the transistor TRd4 and the (+) side of the differential amplifier DA.

Note that, in the readout circuit 81, an emitter follower amplifier may be used in place of the source follower amplifier.

Next, an operation of the readout circuit 81 is described. In the description below, for ease of explanation, the transistors TRc1, TRd1, TRc2, TRd2, TRc4, TRd4, TRe1, and TRe2 are denoted by $\phi1$, $\phi2$, $\phi3$, $\phi4$, $\phi5$, $\phi6$, $\phi7$, and $\phi8$, respectively.

First, before readout, φ1, φ2, φ3, and φ4 are turned on and left for a predetermined time (a CR time constant), so that the potential of the sensor structure 41 and the potential of the sensor structure 40 are reset to predetermined potentials.

Next, φ1, φ2, φ3, φ4, and φ6 are turned off, φ7 and φ8 are turned on, measurement is performed by the sensor structure 41, and the clamp capacitive element CA is reset.

After the measurement by the sensor structure 41 is completed, φ7 and φ8 are turned off, φ1 and φ5 are turned on, and an output of the sensor structure 41 corresponding to an environmental fluctuation output is read into the clamp capacitive element CA.

Next, the signal level read into the clamp capacitive element CA is set to the initial value of the sweep voltage of the $V_{OD}$ circuit, and sweeping at the μV level is prepared from the voltage.

Next, φ5 is turned off, φ8 is turned on, and the (+) input terminal of the differential amplifier DA is reset to the ground voltage.

Next, to turn off φ8 and read out the output of the sensor structure 40 corresponding to an output of the sum of heat generation at the catalyst portion and heat of an environmental fluctuation, φ2 and φ6 are turned on, and the output signal derived from the heat generation in the catalyst portion from which the signal from the environmental fluctuation is subtracted is output to the (+) input terminal of the differential amplifier DA.

Next, a sweep signal in a narrow range is output from the $V_{OD}$ circuit, the points at which the sign of the difference changes at the differential amplifier DA is counted with a counter, a digital output is made, and an output of the gas sensor 1 is read out.

As described above, background noise is removed by subtracting the output signal of the region of the non-catalyst portion from the output signal of the region of the catalyst portion in the above manner, and thus, the S/N ratio of the gas sensor output can be increased.

Example 5

Figure 15:
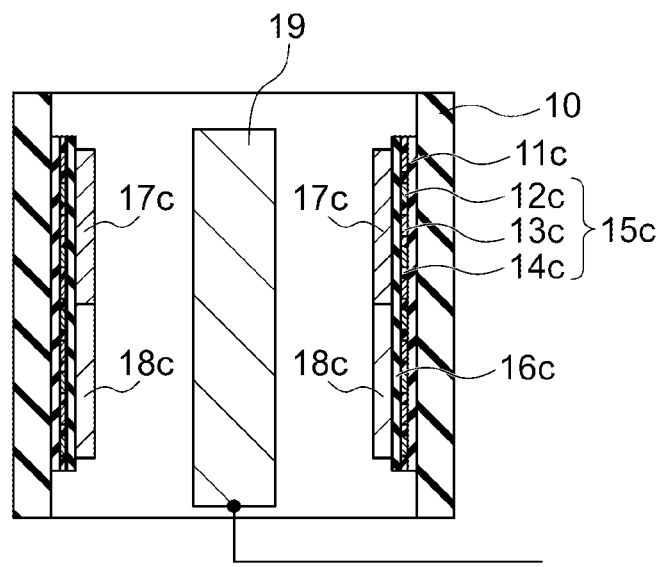
FIG. 15 is a cross-sectional view of the sensor unit of a gas sensor according to Example 5.

FIG. 15 is a cross-sectional view of the sensor unit of a gas sensor according to Example 5. The sensor unit illustrated in FIG. 15 has a substantially cylindrical shape, and a second high thermal conductive insulating film 11c, a thermoelectric conversion film 15c, and a first high thermal conductive insulating film 16c are stacked on the inner peripheral side of the heat insulating substrate 10. On the inner peripheral side of the first high thermal conductive insulating film 16c, a catalyst portion 17c is provided in the upper half region, and a non-catalyst portion 18c is provided in the lower half region. The catalyst portion 17c and the non-catalyst portion 18c have substantially the same areas. The inner peripheral sides of the catalyst portion 17c and the non-catalyst portion 18c are hollow, and form a gas flow path. A cylindrical heater 19 is provided at the center of this hollow portion.

Figure 16:
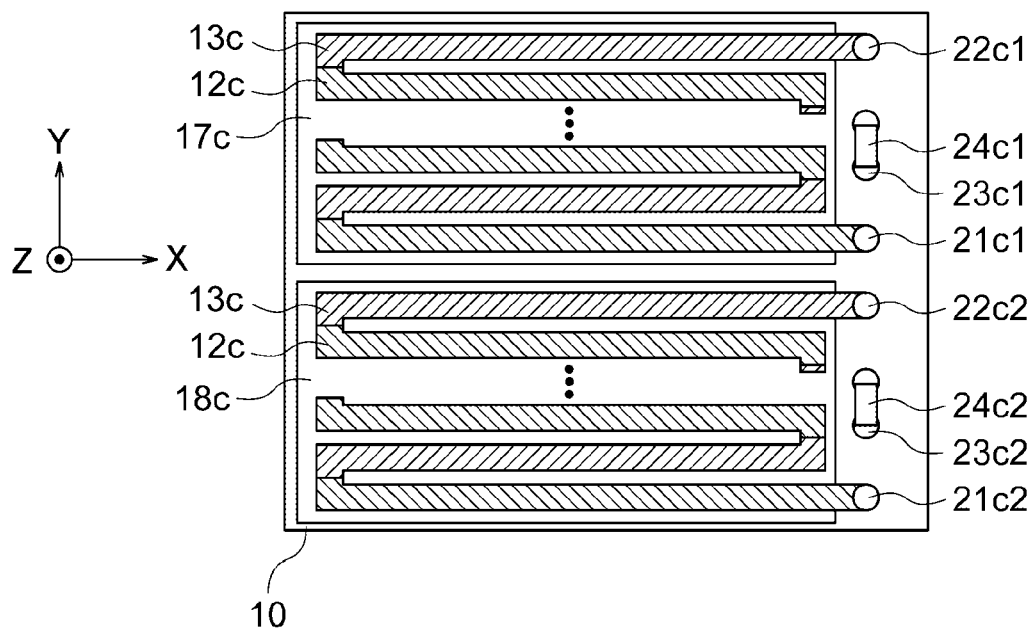
FIG. 16 is a diagram illustrating the layout in a portion of a thermoelectric conversion film of the gas sensor according to Example 5.

FIG. 16 illustrates the layout (a development view) in the thermoelectric conversion film 15c. In each of the regions of the catalyst portion 17c and the non-catalyst portion 18c, a plurality of sets of a first thermoelectric conversion element 12c and a second thermoelectric conversion element 13c is arranged in parallel in a direction perpendicular to the longitudinal direction (the X direction), is electrically connected in series, and has a meandering shape. The layout in the thermoelectric conversion film 15c illustrated in FIG. 16 is equivalent to the layout illustrated in FIGS. 6A and 7 or the layout illustrated in FIGS. 10 and 11.

In the region of the catalyst portion 17c, terminals of a power generator formed with a plurality of series-connected sets of a first thermoelectric conversion element 12c and a second thermoelectric conversion element 13c are connected to the power-supply signal processing unit 4 via through holes 21c1 and 22c1. Further, for example, a temperature sensor 24c1 is mounted on the heat insulating substrate 10 in a region outside the catalyst portion 17c, and temperature can be detected at the power-supply signal processing unit 4 via a through hole 23c1.

In the region of the non-catalyst portion 18c, terminals of a power generator formed with a plurality of series-connected sets of a first thermoelectric conversion element 12c and a second thermoelectric conversion element 13c are connected to the power-supply signal processing unit 4 via through holes 21c2 and 22c2. Further, for example, a temperature sensor 24c2 is mounted on the heat insulating substrate 10 in a region outside the non-catalyst portion 18c, and temperature can be detected at the power-supply signal processing unit 4 via a through hole 23c2.

Example 6

Figure 17:
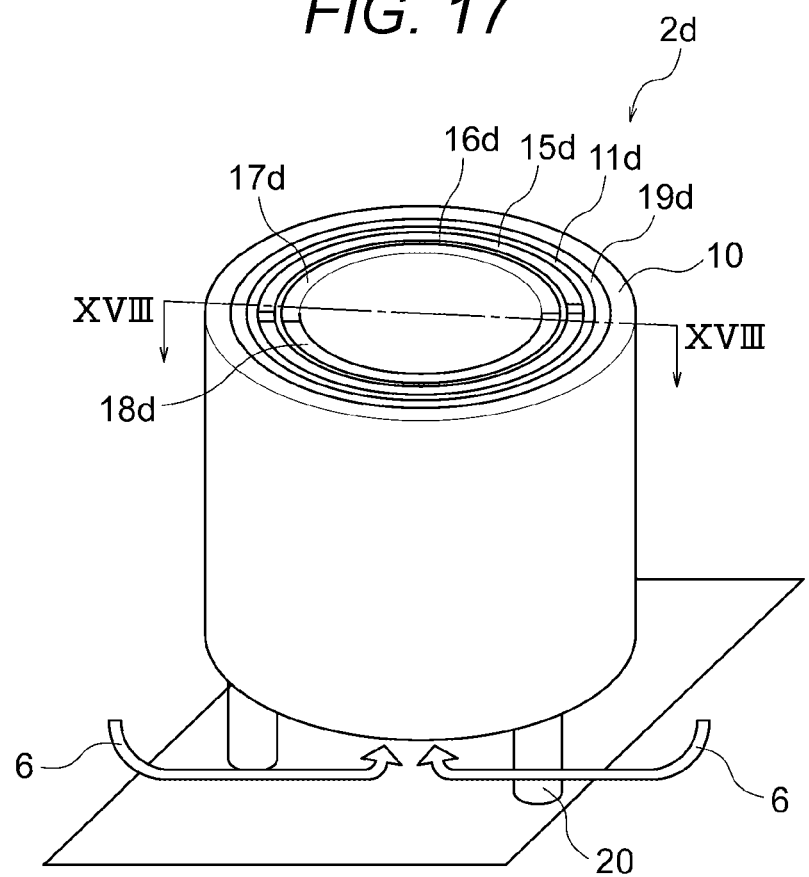
FIG. 17 is a perspective view illustrating the configuration of the sensor unit of a gas sensor according to Example 6.

FIG. 17 is a perspective view of the sensor unit of a gas sensor according to Example 6. The sensor unit according to Example 6 has a substantially cylindrical shape, and a layered heater 19d is provided between the heat insulating substrate 10 and a second high thermal conductive insulating film 11d. The sensor unit according to Example 6 has substantially the same configuration as that of the sensor unit 2 (FIG. 4) of Example 1, except for the heater 19d.

Figure 18:
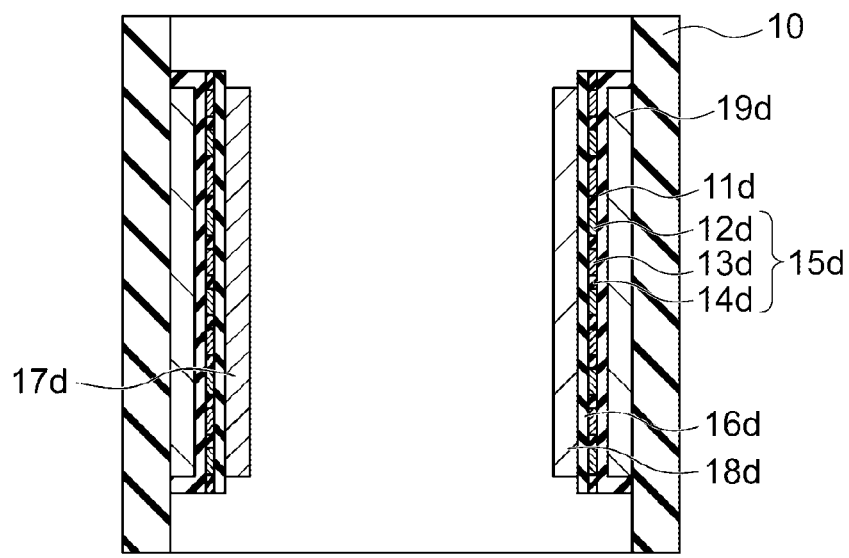
FIG. 18 is a cross-sectional view of the sensor unit of the gas sensor according to Example 6.

FIG. 18 is a cross-sectional view taken along the line XVIII-XVIII defined in FIG. 17. The heater 19d, the second high thermal conductive insulating film 11d, a thermoelectric conversion film 15d, and a first high thermal conductive insulating film 16d are stacked on the inner peripheral side of the heat insulating substrate 10. The inner peripheral surface of the first high thermal conductive insulating film 16d is partitioned into two regions having the same areas at a position intersecting a plane passing through the central axis of the cylindrical shape. A catalyst portion 17d is provided in one region, and a non-catalyst portion 18d is provided in the other region.

Figure 19:
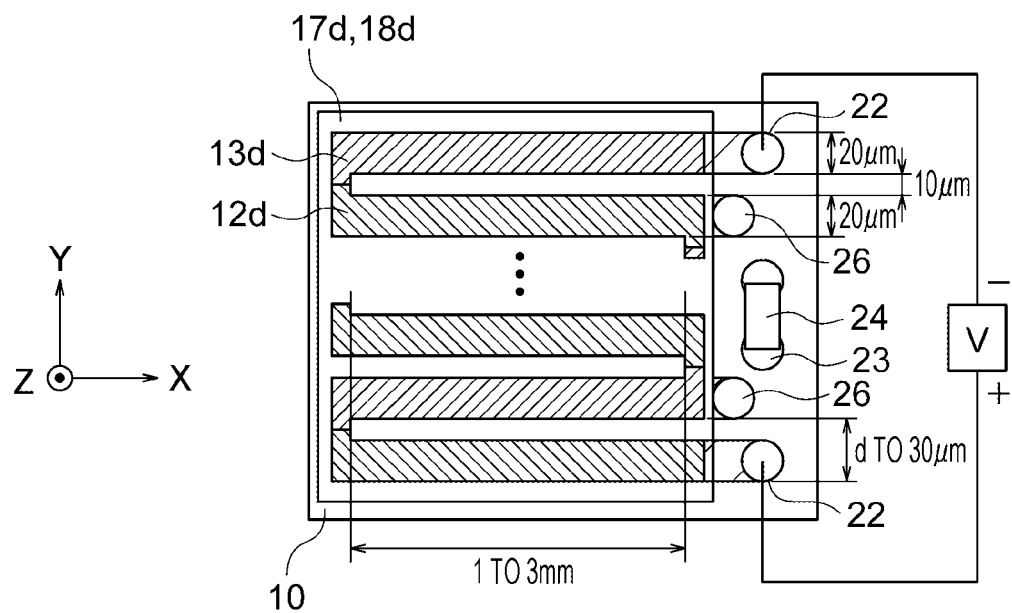
FIG. 19 is a diagram illustrating the layout in a portion of a thermoelectric conversion film of the gas sensor according to Example 6.

FIG. 19 illustrates the layout (a development view) in the thermoelectric conversion film 15d of the gas sensor according to Example 6. In each of the regions of the catalyst portion 17d and the non-catalyst portion 18d, a plurality of sets of a first thermoelectric conversion element 12d and a second thermoelectric conversion element 13d is arranged in parallel in a direction perpendicular to the longitudinal direction (the X direction), is electrically connected in series, and has a meandering shape. The layout in the thermoelectric conversion film 15d illustrated in FIG. 19 is equivalent to the layout illustrated in FIGS. 6A and 7 or the layout illustrated in FIGS. 10 and 11.

As illustrated in FIG. 19, through holes 22 and 26 are formed in the heat insulating substrate 10. The thermoelectric conversion film 15d is connected to the power-supply signal processing unit provided on the outer peripheral surface of the cylindrical sensor unit via the through holes 22. The heater 19d is connected to the power-supply signal processing unit via the through holes 26.

Next, a method for manufacturing the gas sensor according to Example 6 is briefly described. In the description below, an example in which a plurality of sensor structures having the catalyst portion 17d is simultaneously produced on the same heat insulating substrate 10 is explained.

Figure 20:
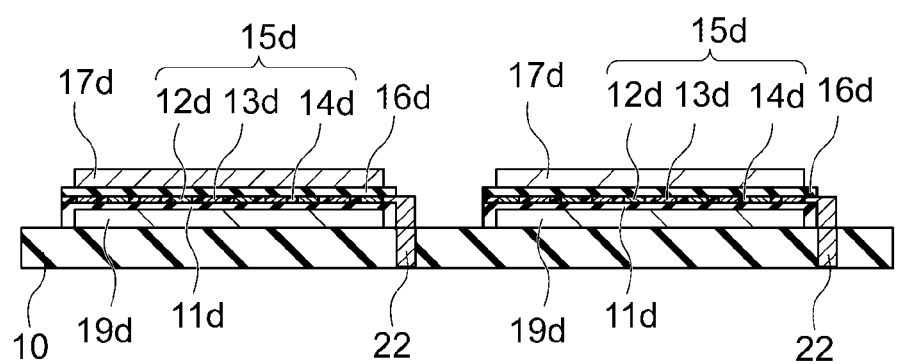
FIG. 20 is a cross-sectional view illustrating production procedures in a method for manufacturing the gas sensor according to Example 6.

First, as illustrated in FIGS. 19 and 20, the through holes 22 for the thermoelectric conversion film 15*d* and the through holes 26 for the heater 19*d* are formed in the heat insulating substrate 10 for the respective sensor structures. Wiring lines that connect the heater 19*d* and the through holes 26 are then formed. Next, as in Example 1, the second high thermal conductive insulating film 11*d* and the thermoelectric conversion film 15*d* (the first thermoelectric conversion elements 12*d*, the second thermoelectric conversion elements 13*d*, and low thermal conductive insulating films 14*d*) are formed. Wiring lines are then formed so that the thermoelectric conversion film 15*d* and the through holes 22 come into ohmic contact with each other. Next, the first high thermal conductive insulating film 16*d* is formed on the thermoelectric conversion film 15*d*.

As illustrated in FIG. 20, the catalyst portion 17*d* is then formed on the first high thermal conductive insulating film 16*d*. In this manner, the plurality of sensor structures is formed on the same heat insulating substrate 10. The heat insulating substrate 10 is cut at the boundary between these sensor structures, so that the individual sensor structures are obtained. A plurality of sensor structures including the non-catalyst portion 18*d* is also formed on the same heat insulating substrate. The sensor structures including the catalyst portion 17*d* and the sensor structures including the non-catalyst portion 18*d* are then bent into a cylinder and combined, to form the cylindrical gas sensor.

Example 7

Figure 21:
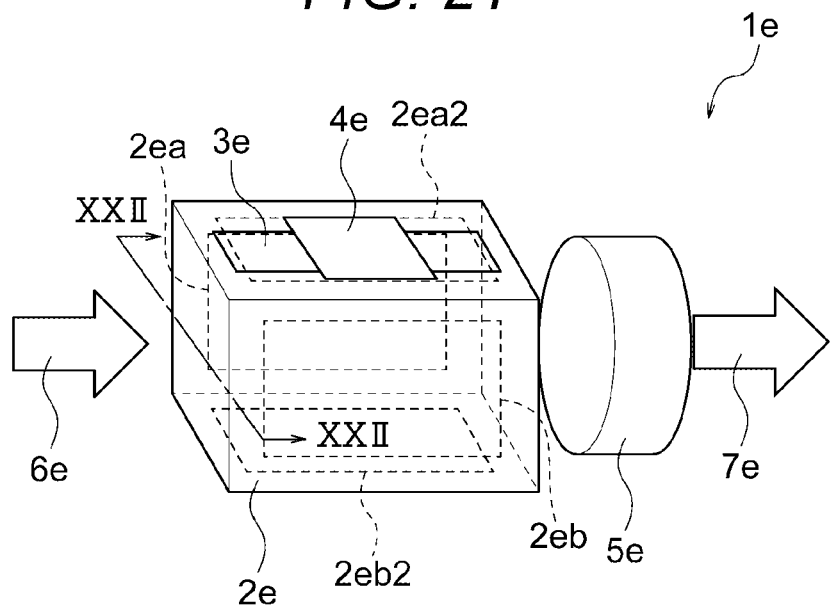
FIG. 21 is a perspective view illustrating the configuration of a gas sensor according to Example 7.
Figure 22:
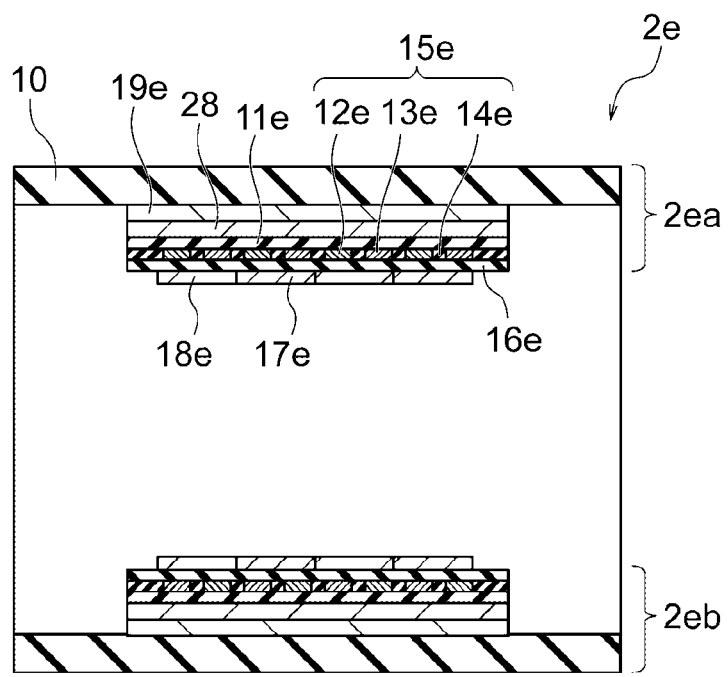
FIG. 22 is a cross-sectional view of a sensor unit of the gas sensor according to Example 7.

FIG. 21 schematically illustrates the configuration of a gas sensor 1*e* according to Example 7. FIG. 22 is a cross-sectional view taken along the line XXII-XXII defined in FIG. 21. The gas sensor 1*e* includes a sensor unit 2*e* having the shape of a substantially rectangular tube, a power-supply signal processing unit 4*e* that is provided on an outer surface of the sensor unit 2*e* and has a readout circuit, a wiring line 3*e* that connects the sensor unit 2*e* and the power-supply signal processing unit 4*e*, and a fan 5*e*. Both ends of the sensor unit 2*e* are open. One opening end side serves as a gas intake path 6*e*, and the other opening end side serves as a gas exhaust path 7*e*.

The gas sensor 1*e* is designed so that the gas outside the sensor unit 2*e* is introduced into the sensor unit 2*e* through the intake path 6*e* by an operation of the fan 5*e*, passes through the sensor unit 2*e*, and is then discharged to the outside of the sensor unit 2*e* through the exhaust path 7*e*. Although the fan 5*e* is provided on the side of the exhaust path 7*e* in FIG. 21, the fan 5*e* may be provided on the side of the intake path 6*e*.

The sensor unit 2*e* is formed by combining sensor structures 2*ea*, 2*ea*2, 2*eb*, and 2*eb*2 into a rectangular tube on the four inner surfaces parallel to the gas flow. In each sensor structure, a heater 19*e*, an insulating film 28, a second high thermal conductive insulating film 11*e*, a thermoelectric conversion film 15*e*, and a first high thermal conductive insulating film 16*e* are stacked on the inner side of the heat insulating substrate 10.

Figure 23:
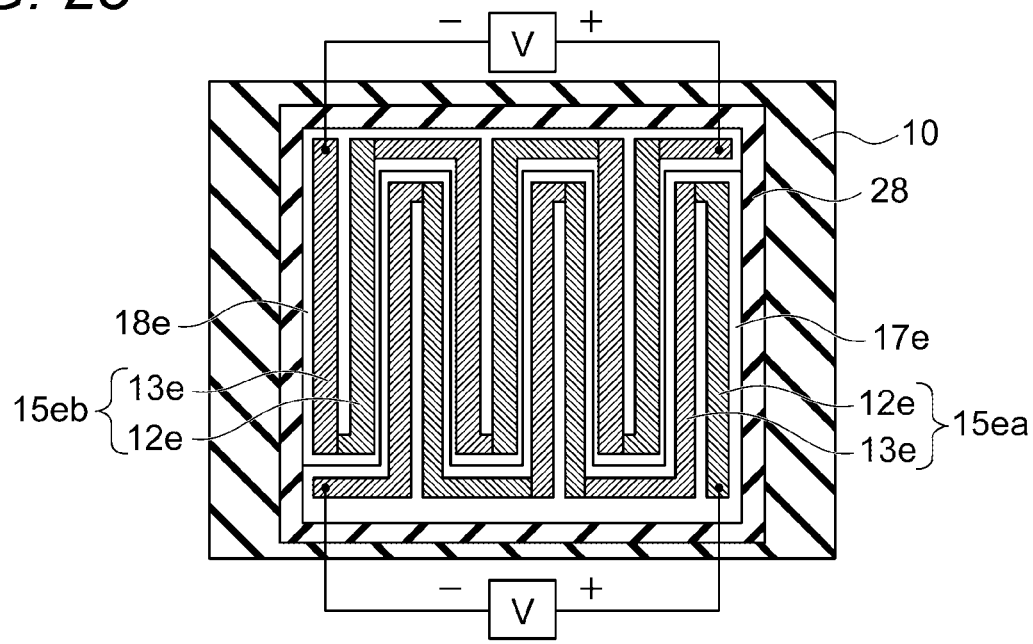
FIG. 23 is a diagram illustrating the layout in a portion of a thermoelectric conversion film of the gas sensor according to Example 7.

As illustrated in FIG. 23, the thermoelectric conversion film 15*e* includes a meandering first thermoelectric conversion unit 15*ea* formed with a plurality of sets of a first thermoelectric conversion element 12*e* and a second thermoelectric conversion element 13*e*, and a meandering second thermoelectric conversion unit 15*eb* formed with a plurality of sets of a first thermoelectric conversion element 12*e* and a second thermoelectric conversion element 13*e*. The first thermoelectric conversion unit 15*ea* and the second thermoelectric conversion unit 15*eb* are disposed to interdigitate with each other. The first thermoelectric conversion elements 12*e* and the second thermoelectric conversion elements 13*e* are arranged in parallel so that the longitudinal direction thereof is perpendicular to the gas flow, are electrically connected in series, and are insulated from each other by a low thermal conductive insulating film 14*e*.

On the inner side (the gas flow path side) of the first high thermal conductive insulating film 16*e*, a catalyst portion 17*e* is provided in the region corresponding to the first thermoelectric conversion unit 15*ea*, and a non-catalyst portion 18*e* is provided in the region corresponding to the second thermoelectric conversion unit 15*eb*. The catalyst portion 17*e* and the non-catalyst portion 18*e* face the inner side of the rectangular tube that serves as the gas flow path.

The first thermoelectric conversion elements 12*e* and the second thermoelectric conversion elements 13*e* are formed with the same material as that of the thermoelectric conversion elements of Example 1. When the catalyst portion 17*e* generates heat by reacting with the gas flowing in the flow path, an electromotive force is generated in each of the adjacent first thermoelectric conversion elements 12*e* and second thermoelectric conversion elements 13*e*, due to the anomalous Nernst effect. Since the first thermoelectric conversion elements 12*e* and the second thermoelectric conversion elements 13*e* are electrically connected in series, electromotive forces are added up, and the output voltage V can be increased.

In the non-catalyst portion 18*e*, there is no heat generation caused by a reaction with the gas flowing in the flow path, but heat from the non-catalyst portion 18*e* or heat from some other environment is conducted to the thermoelectric conversion film 15*e*. An electromotive force is generated in each of the adjacent first thermoelectric conversion elements 12*e* and second thermoelectric conversion elements 13*e*, and these electromotive forces are added up and output.

Note that the catalyst portion 17*e* of the sensor structures 2*ea* and 2*eb* illustrated in FIG. 22, and the catalyst portion of the other sensor structures 2*ea*2 and 2*eb*2 may be formed with catalysts of different materials. A plurality of catalyst portions formed with different catalysts is provided in the gas sensor in this manner, to enable detection of components of a mixed gas.

Figure 24:
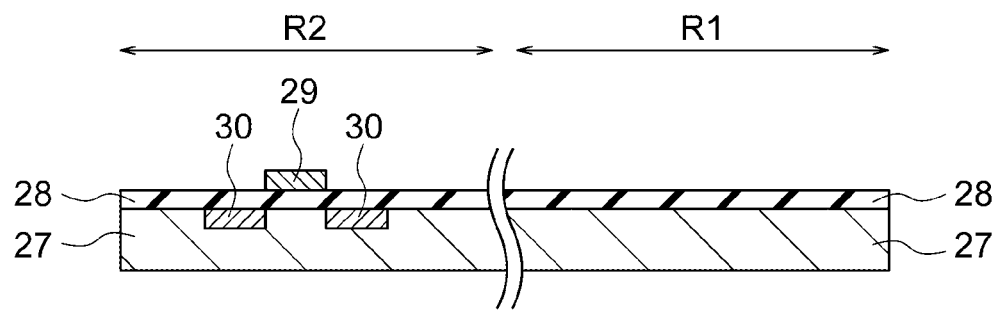
FIG. 24 is a cross-sectional view illustrating procedures in a method for manufacturing the gas sensor according to Example 7.
Figure 25:
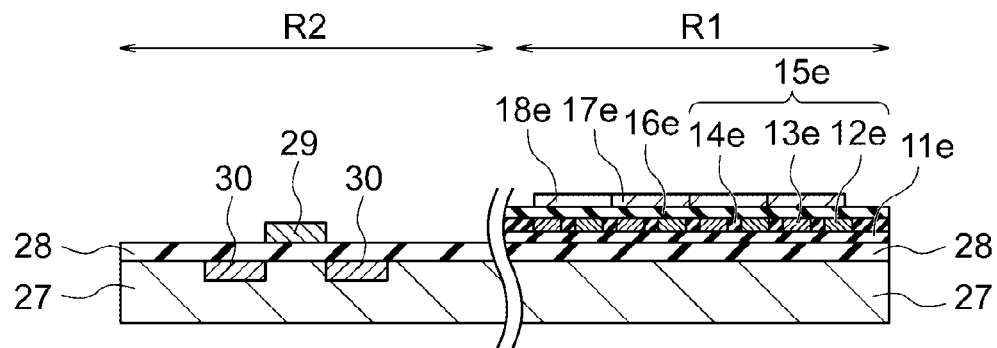
FIG. 25 is a cross-sectional view illustrating procedures continued from FIG. 24.
Figure 26:
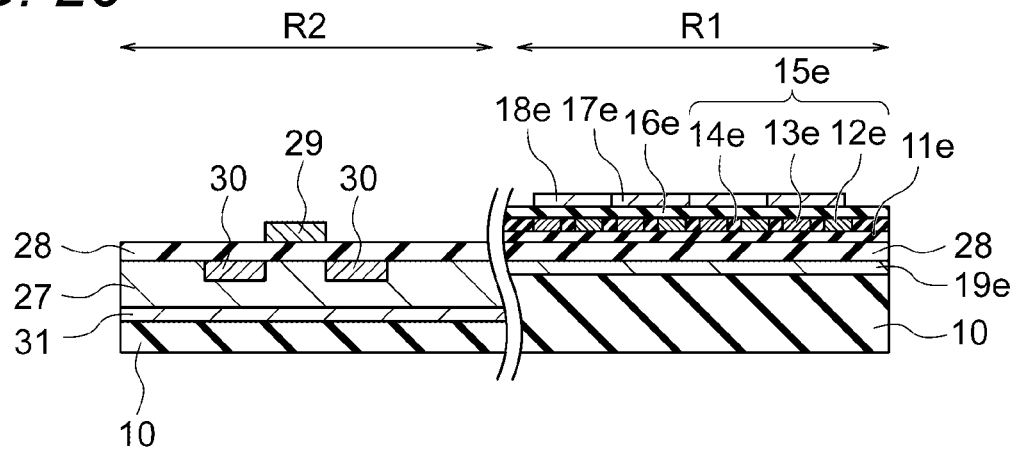
FIG. 26 is a cross-sectional view illustrating procedures continued from FIG. 25.

Next, referring to FIGS. 24 to 26, a method for manufacturing the gas sensor according to Example 7 is described.

First, in a sensor region R1 and a transistor region R2, the insulating film 28 formed with silicon oxide is formed on a silicon substrate 27 by a CVD method or the like. Note that, in practice, transistor regions R2 are provided on both sides of the sensor region R1 (both end portions in the horizontal direction in the drawing), but one of the transistor regions R2 is not illustrated in FIGS. 24 to 26. In the transistor region R2, the insulating film 28 is to be a gate insulating film of a transistor. In the sensor region R1, an insulating film formed with silicon nitride may be further formed on the insulating film 28. The silicon nitride film functions not only as a high thermal conductive insulating film, but also as a tensile stress film when the sensor region R1 is turned into a membrane as described below. Next, a conductive layer of polysilicon or the like is formed by a CVD method or the like, a resist pattern is formed by a photolithography process, an etching process by a reactive ion etching (RIE) method or the like is performed, and a pattern of a gate electrode is processed, to form a gate electrode 29. Subsequently, source/drain regions 30 are formed in the silicon substrate 27 on both side portions of the gate electrode by ion implantation or the like. In this manner, a transistor is formed in the transistor region R2.

Next, as illustrated in FIG. 25, on the insulating film 28 of the silicon substrate 27, the second high thermal conductive insulating film 11e, the thermoelectric conversion film 15e including the first thermoelectric conversion elements 12e, the second thermoelectric conversion elements 13e, and the low thermal conductive insulating film 14e, and the first high thermal conductive insulating film 16e are formed in the same manner as in Example 1. Subsequently, the catalyst portion 17e is formed on the first high thermal conductive insulating film 16e in the region of the catalyst portion 17e. Also, the non-catalyst portion 18e is formed on the first high thermal conductive insulating film 16e in the region of the non-catalyst portion 18e.

Next, as illustrated in FIG. 26, in the sensor region R1, the silicon substrate 27 is removed from the back surface side of the silicon substrate 27 by an etching process such as RIE until the insulating film 28 is exposed. Subsequently, in the sensor region R1, the heater 19e is formed on the back surface side of the insulating film 28. In the step of forming the heater 19e, a wiring line 31 to be connected to the heater 19e is formed in the transistor region R2. Next, in the sensor region R1 and the transistor region R2, the heat insulating substrate 10 is formed on the back surface side of the heater 19e and the wiring line 31. In the above manner, the sensor structures of the gas sensor according to Example 7 can be manufactured.

Example 8

Figure 27:
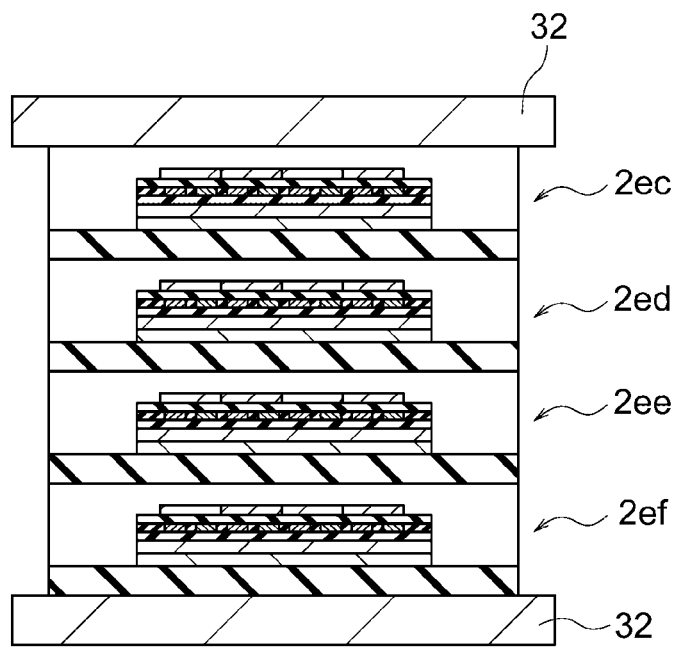
FIG. 27 is a cross-sectional view of the sensor unit of a gas sensor according to Example 8.

FIG. 27 is a cross-sectional view of the sensor unit of a gas sensor according to Example 8. In the sensor unit according to Example 8, a plurality of sensor structures 2ec, 2ed, 2ee, and 2ef is provided, and is held by a holder 32 while being separated from each other. The sensor structures 2ec, 2ed, 2ee, and 2ef have the same configurations as that of the sensor structures 2ea and 2eb (FIG. 22) of Example 7. Each of the sensor structures 2ec, 2ed, 2ee, and 2ef detects gas taken into gaps between these sensor structures.

Note that the number of sensor structures constituting the gas sensor according to Example 8 is not limited to any particular number. Also, the catalyst portions of the plurality of sensor structures may be formed with catalysts of different materials. This makes it possible to detect components of a mixed gas.

Example 9

Figure 28:
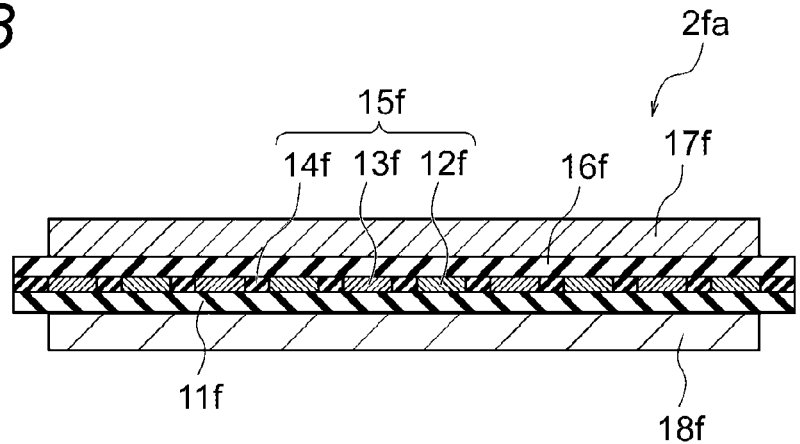
FIG. 28 is a cross-sectional view of the sensor unit of a gas sensor according to Example 9.

FIG. 28 is a cross-sectional view of the sensor unit of a gas sensor according to Example 9. The sensor unit includes a sensor structure 2fa. In the sensor structure 2fa, a first high thermal conductive insulating film 16f is provided on the first surface of a thermoelectric conversion film 15f including first thermoelectric conversion elements 12f, second thermoelectric conversion elements 13f, and low thermal conductive insulating films 14f, and a catalyst portion 17f is provided on the first high thermal conductive insulating film 16f. Further, a second high thermal conductive insulating film 11f is provided on the second surface of the thermoelectric conversion film 15f, and a non-catalyst portion 18f is provided on the surface of the second high thermal conductive insulating film 11f on the opposite side from the thermoelectric conversion film 15f.

Figure 29:
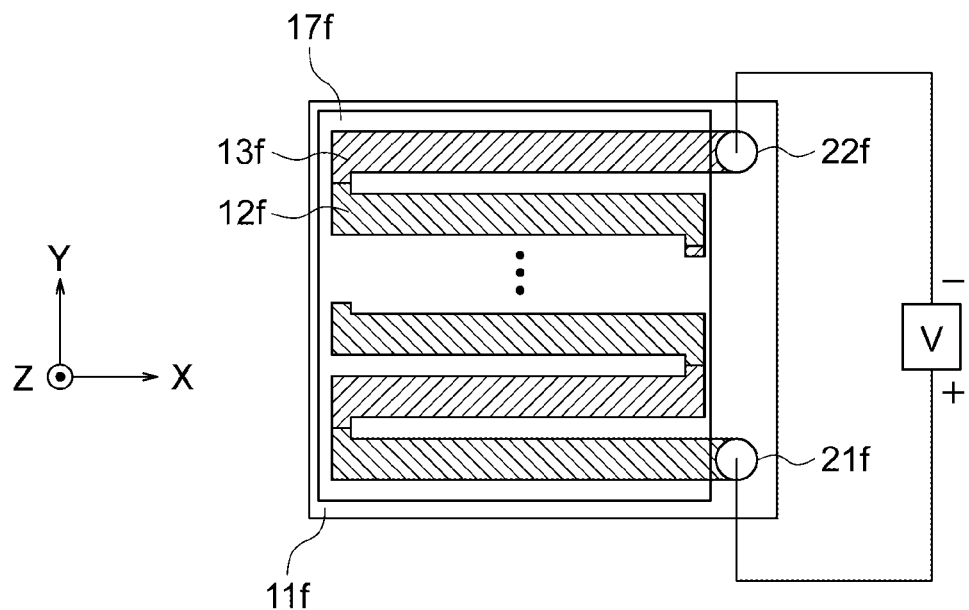
FIG. 29 is a diagram illustrating the layout in a thermoelectric conversion film of the gas sensor according to Example 9.

FIG. 29 illustrates the layout in the thermoelectric conversion film 15f of the gas sensor according to Example 9 illustrated in FIG. 28.

A plurality of sets of a first thermoelectric conversion element 12f and a second thermoelectric conversion element 13f is arranged in parallel in a direction perpendicular to the longitudinal direction (the X direction), is electrically connected in series, and has a meandering shape. The first thermoelectric conversion elements 12f and the second thermoelectric conversion elements 13f are connected to the power-supply signal processing unit via through holes 21f and 22f. The layout in the thermoelectric conversion film 15f illustrated in FIG. 28 is equivalent to the layout illustrated in FIGS. 6A and 7 or the layout illustrated in FIGS. 10 and 11.

Figure 30:
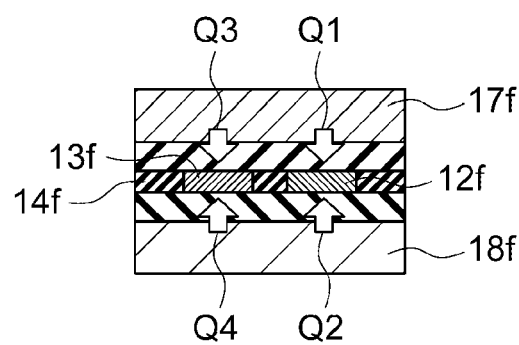
FIG. 30 is a cross-sectional view for explaining a noise cancellation method for a thermoelectric conversion film of the gas sensor according to Example 9.

Next, referring to FIG. 30, a noise cancellation method for the gas sensor of Example 9 illustrated in FIG. 28 is described. When the catalyst portion 17f generates heat by reacting with the gas in the flow path, an electromotive force is generated in the −X direction in the first thermoelectric conversion elements 12f, and an electromotive force is generated in the +X direction in the second thermoelectric conversion elements 13f, due to the anomalous Nernst effect. Here, heat generated from the catalyst portion 17f reacting with the gas flowing in the flow path, and heat Q1 and heat Q3 of an environmental fluctuation are conducted from the first surface of the thermoelectric conversion film 15f, and, from the side of the non-catalyst portion 18f, heat Q2 and heat Q4 of environmental fluctuations are conducted from the second surface of the thermoelectric conversion film 15f. The heat Q1 and the heat Q3 from the first surface of the thermoelectric conversion film 15f and the heat Q2 and the heat Q4 from the second surface are conducted in opposite directions, and the components of the heat of environmental fluctuations are canceled in the thickness direction.

In this manner, the heat due to environmental fluctuations is canceled in the thickness direction, and electromotive forces due to the heat generated from the catalyst portion 17f reacting with gas are generated in the first thermoelectric conversion elements 12f and the second thermoelectric conversion elements 13f. The electromotive forces are added up in the respective adjacent first thermoelectric conversion elements 12f and second thermoelectric conversion elements 13f, and thus, the output voltage V is obtained.

Figure 31:
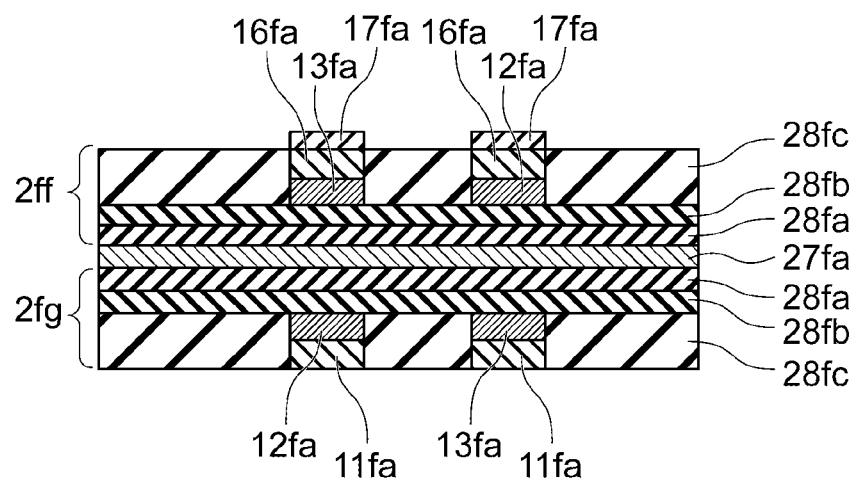
FIG. 31 is a cross-sectional view of the sensor unit of a gas sensor according to a modification of Example 9.

FIG. 31 is a cross-sectional view of the sensor unit of a gas sensor according to a modification of Example 9. In the sensor unit of this modification, a first sensor structure 2ff is provided on the first surface of a silicon substrate 27fa, and a second sensor structure 2fg is provided on the second surface of the silicon substrate 27fa.

In the first sensor structure 2ff, a silicon oxide insulating film 28fa and a silicon nitride insulating film 28fb are sequentially stacked on the silicon substrate 27fa, a thermoelectric conversion film including a first thermoelectric conversion element 12fa and a second thermoelectric conversion element 13fa is provided on the silicon nitride insulating film 28fb, and a high thermal conductive insulating film 16fa is provided on the thermoelectric conversion film. Further, a low thermal conductive insulating film 28fc that insulates the first thermoelectric conversion element 12fa from the adjacent second thermoelectric conversion element 13fa is provided on the silicon nitride insulating film 28fb. A catalyst portion 17fa is provided on the high thermal conductive insulating film 16fa.

The structure of the second sensor structure 2fg is the same as the structure that would be obtained by removing the catalyst portion 17fa from the first sensor structure 2ff. The first sensor structure 2ff and the second sensor structure 2fg are disposed so that that the catalyst portion 17fa of the first sensor structure 2ff and a high thermal conductive insulating film 11fa of the second sensor structure 2fg face the opposite sides from each other.

In the gas sensor illustrated in FIG. 31, components of heat of environmental fluctuations can be canceled in the thickness direction, as in a case with the noise cancellation method illustrated in FIG. 30.

Example 10

Figure 32:
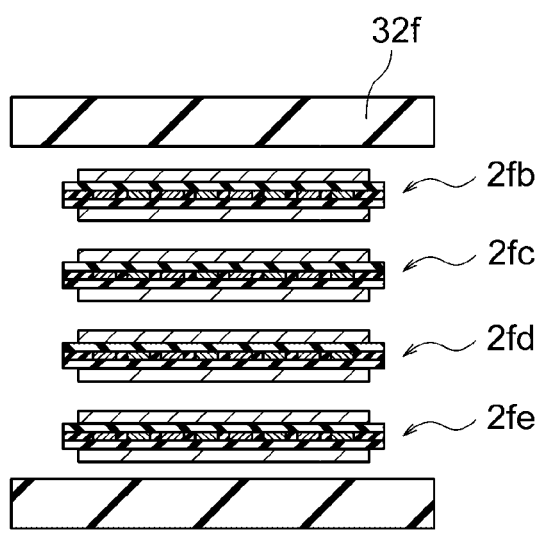
FIG. 32 is a cross-sectional view of the sensor unit of a gas sensor according to Example 10, taken along a plane parallel to a gas flow.
Figure 33:
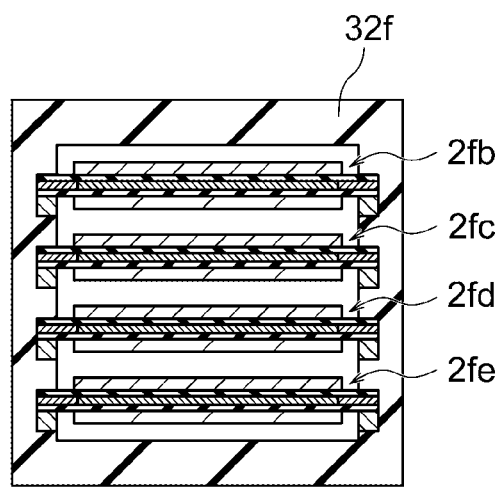
FIG. 33 is a cross-sectional view of the sensor unit of the gas sensor according to Example 10, taken along a plane perpendicular to the gas flow.

FIG. 32 is a cross-sectional view of the sensor unit of a gas sensor according to Example 10, taken along a plane parallel to the gas flow. FIG. 33 is a cross-sectional view of the sensor unit of the gas sensor according to Example 10, taken along a plane perpendicular to the gas flow. In the sensor unit of the gas sensor according to Example 10, a plurality of sensor structures 2fb, 2fc, 2fd, and 2fe is held by a holder 32f while being separated from each other. Each of the sensor structures 2fb, 2fc, 2fd, and 2fe has the same configuration as that of the sensor structure 2fa of Example 9. The sensor structures 2fb, 2fc, 2fd, and 2fe detect gas taken into gaps between these sensor structures.

Note that the number of sensor structures constituting the gas sensor according to Example 10 is not limited to any particular number. Also, the catalyst portions of the plurality of sensor structures may be formed with catalysts of different materials. This makes it possible to detect components of a mixed gas.

Example 11

Figure 34:
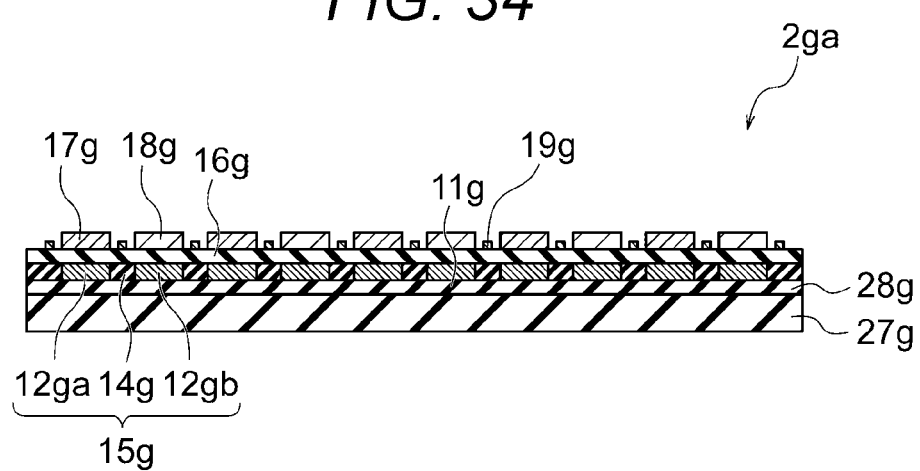
FIG. 34 is a cross-sectional view of the sensor unit of a gas sensor according to Example 11.

FIG. 34 is a cross-sectional view of the sensor unit of a gas sensor according to Example 11. The sensor unit includes a sensor structure 2ga. In the sensor structure 2ga, an insulating film 28g, a second high thermal conductive insulating film 11g, a thermoelectric conversion film 15g including first thermoelectric conversion elements 12ga, second thermoelectric conversion elements 12gb, and low thermal conductive insulating films 14g, and a first high thermal conductive insulating film 16g are stacked on a silicon substrate 27g.

Figure 35:
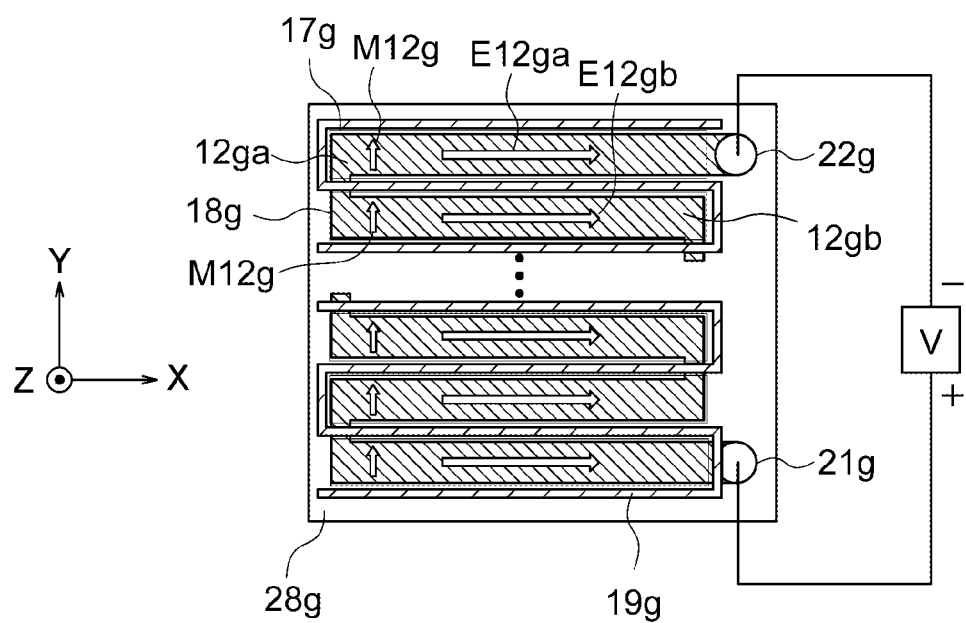
FIG. 35 is a diagram illustrating the layout in a thermoelectric conversion film of the gas sensor according to Example 11.

As illustrated in FIG. 35, in thermoelectric conversion film 15g, the sets in a plurality of sets of a first thermoelectric conversion element 12ga and a second thermoelectric conversion element 12gb each having a shape extending in one direction (the X direction) are insulated from each other by a low thermal conductive insulating film 14g, and are alternately arranged in parallel in a direction (the Y direction) orthogonal to the one direction. The plurality of sets of a first thermoelectric conversion element 12ga and a second thermoelectric conversion element 12gb is electrically connected in series, and has a meandering shape. The first thermoelectric conversion elements 12ga and the second thermoelectric conversion elements 12gb are formed with the same material, and are magnetized in the same direction (the direction of magnetization M12g). The first thermoelectric conversion elements 12ga and the second thermoelectric conversion elements 12gb are connected to the power-supply signal processing unit via through holes 21g and 22g.

On the first high thermal conductive insulating film 16g, catalyst portions 17g are provided at the positions corresponding to the first thermoelectric conversion elements 12ga, and non-catalyst portions 18g are provided at the positions corresponding to the second thermoelectric conversion elements 12gb. Further, on the first high thermal conductive insulating film 16g, a heater 19g is provided in a meandering shape so as if to thread between the catalyst portions 17g and the non-catalyst portions 18g.

Next, a noise cancellation method for the thermoelectric conversion film 15g of the gas sensor according to Example 11 is described. When the catalyst portions 17g generate heat by reacting with the gas flowing in the flow path, an electromotive force E12ga is generated in the +X direction in the first thermoelectric conversion elements 12ga, due to the anomalous Nernst effect. The electromotive force E12ga is an electromotive force due to the heat generated from the catalyst portions 17g reacting with the gas and heat of an environmental fluctuation. On the other hand, when heat from the non-catalyst portions 18g is conducted to the second thermoelectric conversion elements 12gb, an electromotive force E12gb is generated in the +X direction. The electromotive force E12gb is an electromotive force due to heat of an environmental fluctuation. The electromotive forces generated in the first thermoelectric conversion elements 12ga and the second thermoelectric conversion elements 12gb cancel each other. In this manner, the electromotive force due to an environmental fluctuation in the in-plane direction is canceled, and the electromotive forces due to the heat generated from the catalyst portions 17g reacting with the gas are added up in the respective first thermoelectric conversion elements 12ga of the plurality of first thermoelectric conversion elements 12ga, and thus, the output voltage V is obtained.

Example 12

Figure 36:
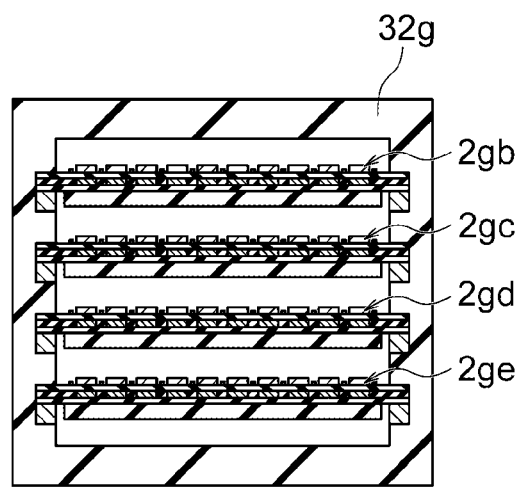
FIG. 36 is a cross-sectional view of the sensor unit of a gas sensor according to Example 12.

FIG. 36 is a cross-sectional view of the sensor unit of a gas sensor according to Example 12, taken along a plane perpendicular to the gas flow. In the sensor unit of the gas sensor according to Example 12, a plurality of sensor structures 2gb, 2gc, 2gd, and 2ge is held by a holder 32g while being separated from each other. The sensor structures 2gb, 2gc, 2gd, and 2ge have the same configuration as that of the sensor structure 2ga (FIG. 34) of Example 11. The sensor structures 2gb, 2gc, 2gd, and 2ge detect gas taken into gaps between these sensor structures.

Note that the number of sensor structures constituting the gas sensor according to Example 12 is not limited to any particular number. Also, the catalyst portions of the plurality of sensor structures may be formed with catalysts of different materials. This makes it possible to detect components of a mixed gas.

Example 13

Figure 37:
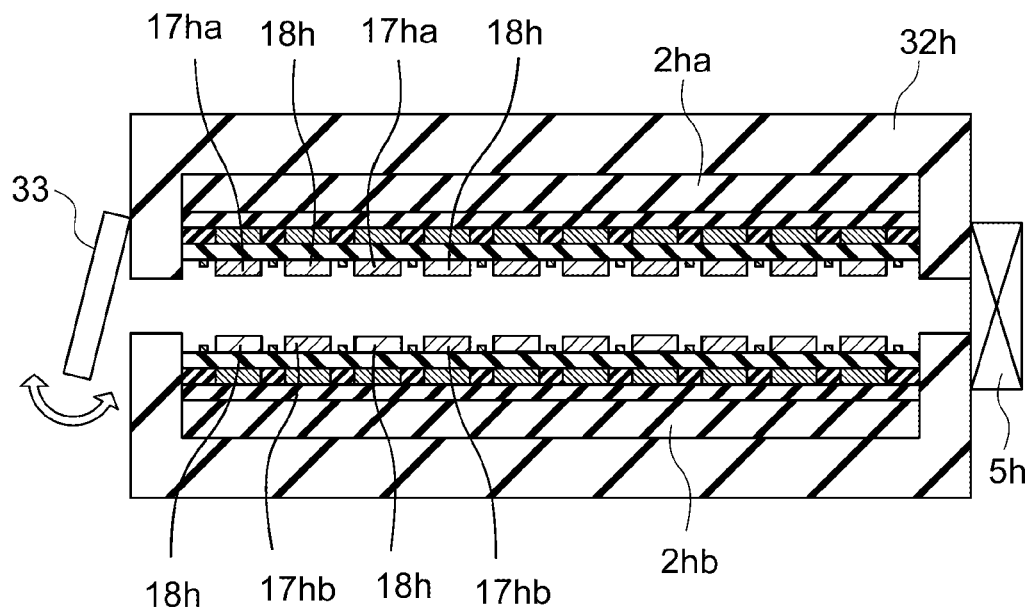
FIG. 37 is a cross-sectional view of a gas sensor according to Example 13.

FIG. 37 is a cross-sectional view of a gas sensor according to Example 13, taken along a plane parallel to the gas flow. The gas sensor according to Example 13 includes a first sensor structure 2ha and a second sensor structure 2hb. The first sensor structure 2ha and the second sensor structure 2hb are held by a holder 32h so as to face each other across the gas flow path. The holder 32h has a shutter 33 provided on the gas inlet side and a fan 5h provided on the gas outlet side.

The first sensor structure 2ha and the second sensor structure 2hb have the same configuration as that of the sensor structure 2ga (FIG. 34) of Example 11. The first sensor structure 2ha has catalyst portions 17ha and non-catalyst portions 18h on the gas flow path side. The second sensor structure 2hb has catalyst portions 17hb and non-catalyst portions 18h on the gas flow path side. The catalyst portions 17ha of the first sensor structure 2ha and the catalyst portions 17hb of the second sensor structure 2hb are formed with catalysts of different materials, and react with different components constituting a gas. Thus, each component of a mixed gas can be detected.

Example 14

Figure 38:
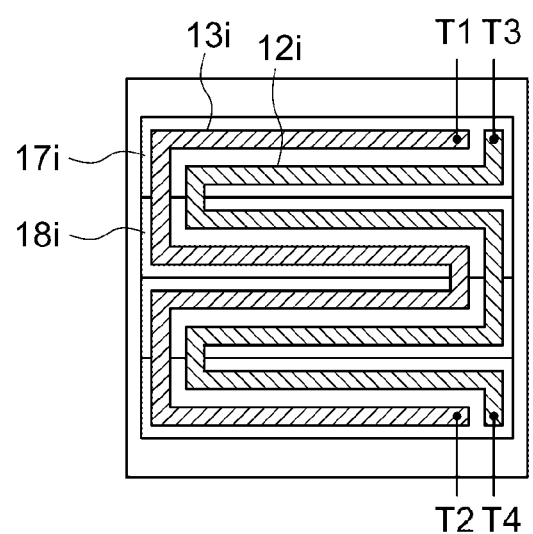
FIG. 38 is a diagram illustrating the layout in a thermoelectric conversion film of a gas sensor according to Example 14.

FIG. 38 illustrates the layout in a thermoelectric conversion film of a gas sensor according to Example 14. The thermoelectric conversion film of Example 14 includes a first thermoelectric conversion unit formed with a plurality of thermoelectric conversion elements 12$i$, and a second thermoelectric conversion unit formed with a plurality of thermoelectric conversion elements 13$i$. The first thermoelectric conversion unit and the second thermoelectric conversion unit have the same configuration as that of the thermoelectric conversion film illustrated in FIG. 35, and are disposed so as to mesh with each other.

In the first thermoelectric conversion unit, catalyst portions 17$i$ are provided in the regions corresponding to the thermoelectric conversion elements 12$i$ in the odd-numbered rows, and non-catalyst portions 18$i$ are provided in the regions corresponding to the thermoelectric conversion elements 12$i$ in the even-numbered rows. Likewise, in the second thermoelectric conversion unit, catalyst portions 17$i$ are provided in the regions corresponding to the thermoelectric conversion elements 13$i$ in the odd-numbered rows, and non-catalyst portions 18$i$ are provided in the regions corresponding to the thermoelectric conversion elements 13$i$ in the even-numbered rows.

In the first thermoelectric conversion unit formed with the plurality of thermoelectric conversion elements 12$i$, it is possible to remove background noise in the in-plane direction by subtracting the electromotive force due to heat in the regions of the non-catalyst portions 18$i$ from the electromotive force due to heat in the regions of the catalyst portions 17$i$. The output from the first thermoelectric conversion unit is output from terminals T3 and T4 to the outside.

Likewise, in the second thermoelectric conversion unit formed with the plurality of thermoelectric conversion elements 13$i$, it is possible to remove background noise in the in-plane direction by subtracting the electromotive force due to heat in the regions of the non-catalyst portions 18$i$ from the electromotive force due to heat in the regions of the catalyst portions 17$i$. The output from the second thermoelectric conversion unit is output from terminals T1 and T2 to the outside.

Example 15

Figure 39:
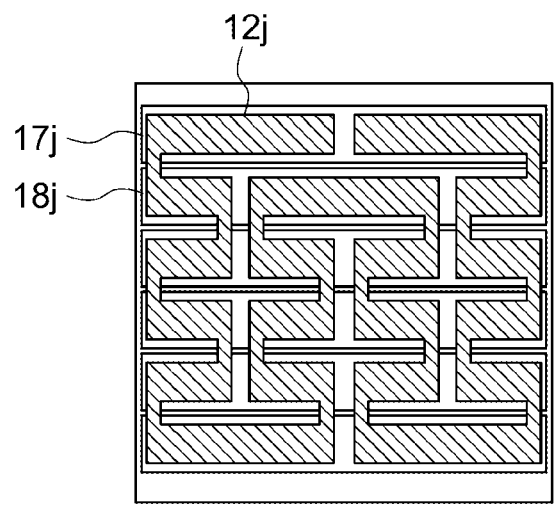
FIG. 39 is a diagram illustrating the layout in a thermoelectric conversion film of a gas sensor according to Example 15.

FIG. 39 illustrates the layout in a thermoelectric conversion film of a gas sensor according to Example 15. The thermoelectric conversion film of Example 15 has a meandering shape, as thermoelectric conversion elements 12$j$ that have the same or different lengths in the longitudinal direction are arranged side by side in the longitudinal direction (column direction), are arranged also in parallel in a direction perpendicular to the longitudinal direction (row direction), and are electrically connected in series. Each of the thermoelectric conversion elements 12$j$ has the same configuration as that of the first thermoelectric conversion elements 12$ga$ and the second thermoelectric conversion elements 12$gb$ illustrated in FIG. 35, except for the length in the longitudinal direction.

Catalyst portions 17$j$ are provided in the regions corresponding to the thermoelectric conversion elements 12$j$ in the odd-numbered rows, and non-catalyst portions 18$j$ are provided in the regions corresponding to the thermoelectric conversion elements 12$j$ in the even-numbered rows. In the thermoelectric conversion film of Example 15, it is also possible to remove background noise in the in-plane direction by subtracting the electromotive force due to heat in the regions of the non-catalyst portions 18$j$ from the electromotive force due to heat in the regions of the catalyst portions 17$j$. In particular, compared with the thermoelectric conversion film illustrated in FIG. 35, the thermoelectric conversion film of Example 15 has more connections (bends) between the thermoelectric conversion elements 12$j$ that are adjacent to each other in the row direction. Thus, noise can be locally canceled.

Example 16

Figure 40:
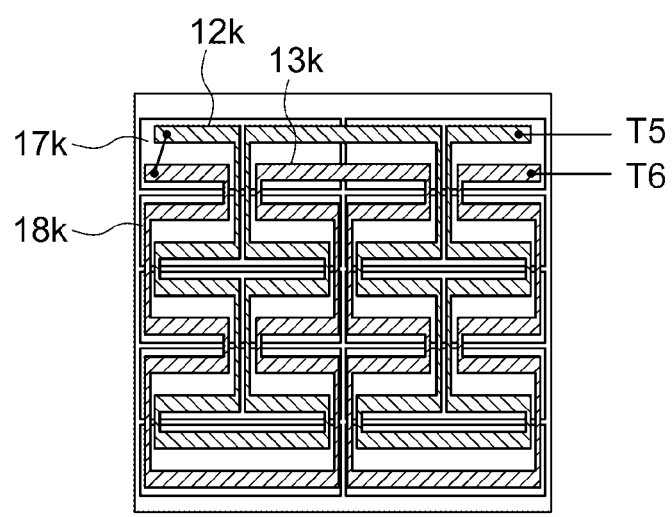
FIG. 40 is a diagram illustrating the layout in a thermoelectric conversion film of a gas sensor according to Example 16.

FIG. 40 illustrates the layout in a thermoelectric conversion film of a gas sensor according to Example 16. In the thermoelectric conversion film of Example 16, two thermoelectric conversion films (hereinafter referred to as the first thermoelectric conversion unit and the second thermoelectric conversion unit) having the same configuration as that of the thermoelectric conversion film of Example 15 illustrated in FIG. 39 are disposed so as to mesh with each other. The first thermoelectric conversion unit includes a plurality of first thermoelectric conversion elements 12$k$, and the second thermoelectric conversion unit includes a plurality of second thermoelectric conversion elements 13$k$.

Catalyst portions 17$k$ are provided in the regions corresponding to the first thermoelectric conversion elements 12$k$ and the second thermoelectric conversion elements 13$k$ in the odd-numbered rows, and non-catalyst portions 18$k$ are provided in the regions corresponding to the first thermoelectric conversion elements 12$k$ and the second thermoelectric conversion elements 13$k$ in the even-numbered rows. One terminal of the first thermoelectric conversion unit and one terminal of the second thermoelectric conversion unit are connected. In FIG. 40, the other terminal of the first thermoelectric conversion unit and the other terminal of the second thermoelectric conversion unit are denoted by T5 and T6, respectively.

In each of the first thermoelectric conversion elements 12$k$ and the second thermoelectric conversion elements 13$k$, it is possible to remove background noise in the in-plane direction by subtracting the electromotive force due to heat in the regions of the non-catalyst portions 18$k$ from the electromotive force due to heat in the regions of the catalyst portions 17$k$. In particular, in the thermoelectric conversion film of Example 16, the connections (bends) between the first thermoelectric conversion elements 12$k$ adjacent to each other in the row direction and the connections (bends) between the second thermoelectric conversion elements 13$k$ adjacent to each other in the row direction are further increased, and the local noise cancellation effect can be enhanced.

Example 17

Figure 41:
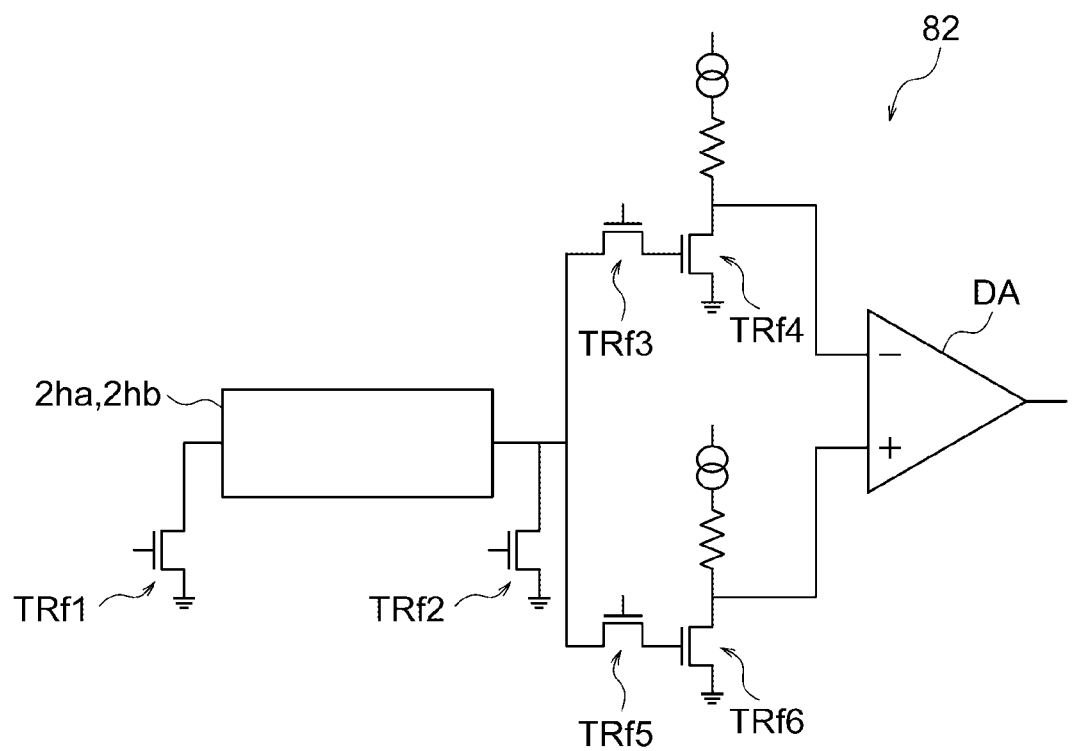
FIG. 41 is a diagram illustrating a readout circuit of a gas sensor according to Example 17.

FIG. 41 illustrates the configuration of a readout circuit 82 of a gas sensor according to Example 17. The readout circuit 82 of Example 17 is provided in the power-supply signal processing unit, and is a readout circuit that can be applied to Example 13 (FIG. 37) in particular.

As illustrated in FIG. 41, the source of a transistor TRf1 is connected to one terminal of a first or second sensor structure 2$ha$ or 2$hb$, the source of a transistor TRf2 is connected to the other terminal, the gate of a transistor TRf4 is connected to the other terminal via a transistor TRf3, and the gate of a transistor TRf6 is connected to the other terminal via a transistor TRf5. The transistor TRf4 and the transistor TRf6 are source follower amplifiers that amplify an output of the first or second sensor structure 2ha or 2hb. The transistor TRf4 is connected to the (−) side of the differential amplifier DA. The transistor TRf6 is connected to the (+) side of the differential amplifier DA.

Note that, in the readout circuit 82, emitter follower amplifiers may be used in place of the source follower amplifiers.

Next, referring to FIGS. 37 and 41, an operation of the readout circuit 82 is described. First, the first and second sensor structures 2ha and 2hb are initialized as follows. The shutter 33 at the gas inlet is turned off, the fan 5h is turned on, and the inside of the holder 32h is filled with a standard gas (for example, the air) not including the detection target gas. In a case where it takes time to replace the gas, there is also a method for putting the gas from a cylinder containing the standard gas through the gas inlet. At this point of time, the transistors TRf1 and TRf2 connected to both ends of each of the first and second sensor structures 2ha and 2hb are turned on, and the potentials at both ends are reset to a desired voltage that is the ground potential, for example.

Next, the heater provided in the vicinity of the catalyst portion is turned on, and is made to stand by until the temperature of the heater reaches a desired temperature (for example, 100° C.). Since the first and second sensor structures 2ha and 2hb are membrane structures herein, the total heat capacity is very small, and the temperature of the heater reaches the desired temperature in 0.1 s.

Next, a signal before gas introduction is read out. The signal before gas introduction is a signal corresponding to a noise component generated by an environmental fluctuation. As described above, after the initialization of the first and second sensor structures 2ha and 2hb is completed, a signal is read out while the inside of the holder 32h is filled with the standard gas. Specifically, the transistor TRf1 is turned on, the transistor TRf2 is turned off, the transistor TRf3 is turned on, and, at the same time, the transistor TRf5 is turned off. As a result, the signal before gas introduction, which is the signal corresponding to a noise component generated by an environmental fluctuation, is input to the (−) side of the differential amplifier DA. Ideally, the electromotive forces generated in the thermoelectric conversion elements are canceled inside, and a zero potential is output. However, there are cases where a zero potential is not output due to the presence of an asymmetric portion in the thermoelectric conversion elements. Therefore, the signal before gas introduction, which is the signal of a noise component generated by an environmental fluctuation, is read out as described above, so that temperature unevenness in the gas sensor can be corrected.

Next, a signal during gas introduction is read out. The transistor TRf1 is turned on, the transistor TRf2 is turned off, the transistor TRf3 is turned off, and, at the same time, the transistor TRf5 is turned on. At the same time, the shutter 33 at the gas inlet is turned on, and the fan 5h is turned on. As a result, the gas is introduced into the holder 32h. Since the catalyst portions are heated to 100° C. by the heater, and the heat capacity of the regions of the catalyst portions is larger than that of the gas, the temperature decrease due to the gas is at a negligible level. As a result, the signal after gas introduction, which is the signal corresponding to a noise component generated by the reaction heat from the catalyst portions and an environmental fluctuation, is input to the (+) side of the differential amplifier DA.

Next, a signal during gas introduction is read out by the differential amplifier DA. The transistor TRf3 is turned off, and, at the same time, the transistor TRf5 is turned off, so that the difference between the outputs of the two source follower amplifiers is output from the differential amplifier DA. The transistors TRf1 and TRf2 are then turned on, and the shutter 33 is turned off, so that the first and second sensor structures 2ha and 2hb are reset for the next sensing.

As described above, it is possible to remove background noise by reading out the difference between the electromotive force generated in the thermoelectric conversion elements before the gas is introduced into the gas sensor, and the electromotive force generated in the thermoelectric conversion elements when the gas is introduced into the gas sensor.

With the gas sensors according to Examples 1 to 17, the following effects can be achieved.

(1) The thermoelectric conversion film exhibiting the anomalous Nernst effect can be made thinner, and the entire sensor can be made smaller in size.

(2) Through the reduction in size, it is possible to design a sensor unit with a lowered heat capacity, and reduce power consumption even in a case where a heater or the like is included therein. Also, through the reduction in size, the sensor unit can be incorporated into a mobile device or the like, and can be used in, for example, component analysis of human breath, health management, and the like.

(3) Background noise is removed, so that even a low-concentration gas (for example, about 1 ppm) can be detected with a high sensitivity and a high S/N ratio.

(4) In a structure in which a plurality of sensor structures is stacked, various catalysts are disposed in the respective sensor structures, so that a mixed gas can be identified from the respective signal outputs.

(5) A film of a substantially cylindrical sensor structure is formed on a large flexible substrate in a roll-to-roll manner. After the film formation, the film is connected to an external power-supply signal processing unit via a through hole formed in the flexible substrate. The two processes can be separated, and the film can be manufactured by a manufacturing process with a high yield.

(6) A continuous film forming process is used in a conventional semiconductor process (part of which is a MEMS process), and it is possible to prevent the occurrence of problems such as a mechanical thermal contact failure.

(7) The area per device can be easily increased, and the catalytic reaction rate can be adjusted with a heater. Thus, the concentration of the gas to be detected can be adjusted.

Note that the features of the gas sensors according to Examples 1 to 17 described above may be combined as appropriate. This makes it possible to form a more sophisticated gas sensor.

Next, an example in which the thermoelectric device of this embodiment is applied to a cooling device is described.

Example 18

Figure 42:
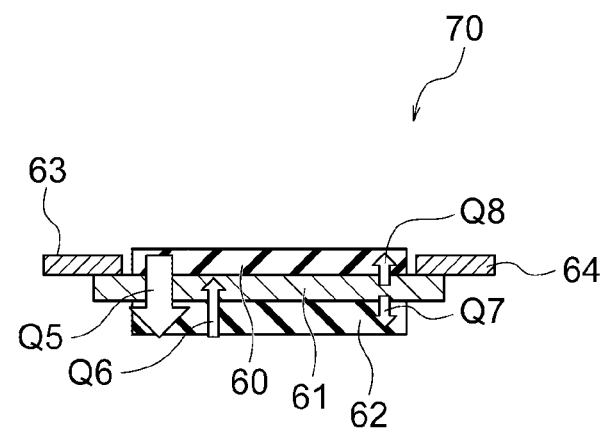
FIG. 42 is a cross-sectional view of a cooling device according to Example 18.

FIG. 42 is a cross-sectional view of a cooling device 70 according to Example 18. In the cooling device 70 of Example 18, a first high thermal conductive insulating film 60 is provided on the first surface of a thermoelectric conversion film 61, and a second high thermal conductive insulating film 62 is provided on the second surface. Wiring lines 63 and 64 are connected to the thermoelectric conversion film 61. The thermoelectric conversion film 61 has the same configuration as that of the thermoelectric conversion film 15 described in Example 1. The surface of the first high thermal conductive insulating film 60 on the opposite side from the thermoelectric conversion film 61 is a cooling surface, and the surface of the second high thermal conductive insulating film 62 on the opposite side from the thermoelectric conversion film 61 is a heat dissipation surface.

In the cooling device 70, an electric current is made to flow from the wiring lines 63 and 64 to the thermoelectric conversion film 61, so that heat transport is caused by the Ettingshausen effect in the thermoelectric conversion elements included in the thermoelectric conversion film 61. As a result, the heat on the cooling side can be transported to the heat dissipation side. In FIG. 42, an arrow Q5 indicates heat transport by the Ettingshausen effect, an arrow Q6 indicates heat conduction (heat inflow from high temperature), and arrows Q7 and Q8 indicate Joule heat.

With the cooling device 70 according to Example 18, it is possible to generate a heat flow in a predetermined direction in the thermoelectric conversion elements by causing an electric current to flow from the external power supply to the thermoelectric conversion elements, and perform heat transport via the high thermal conductive insulating film. The cooling device 70 has a simple configuration, and the length of the thermoelectric conversion elements in the longitudinal direction can be easily increased. Thus, the performance of the cooling device 70 can be enhanced. Also, the thickness of the cooling device 70 can be reduced, and accordingly, the device size can be made smaller. Further, efficient heat transport with the outside via the first high thermal conductive insulating film 60 and the second high thermal conductive insulating film 62 is possible, and thus, the performance of the cooling device 70 can be enhanced.

Example 19

Figure 43:
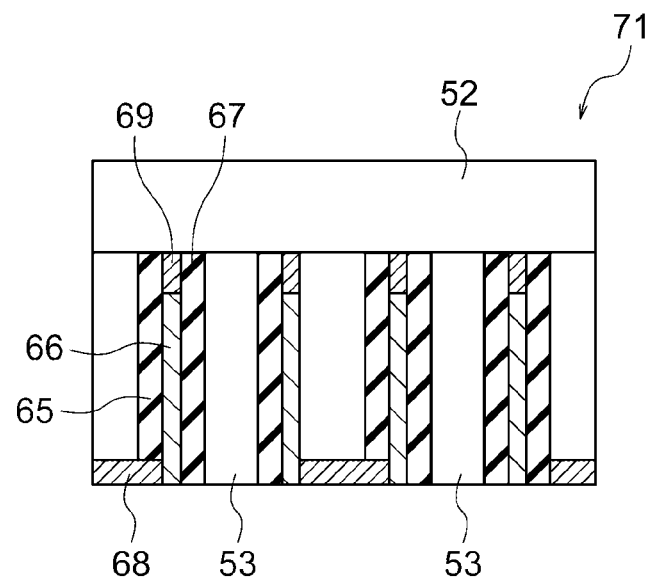
FIG. 43 is a cross-sectional view of a cooling device according to Example 19.

FIG. 43 is a cross-sectional view of a cooling device 71 according to Example 19. In the cooling device 71 of Example 19, a first high thermal conductive insulating film 65 is provided on the first surface of a thermoelectric conversion film 66, and a second high thermal conductive insulating film 67 is provided on the second surface. Wiring lines 68 and 69 are connected to both ends of the thermoelectric conversion film 66. The thermoelectric conversion film 66 has the same configuration as that of the thermoelectric conversion film 15 described in Example 1. The surface of the first high thermal conductive insulating film 65 on the opposite side from the thermoelectric conversion film 66 is a cooling surface, and the surface of the second high thermal conductive insulating film 67 on the opposite side from the thermoelectric conversion film 66 is a heat dissipation surface.

In the cooling device 71, an electric current is made to flow from the wiring lines 68 and 69 to the thermoelectric conversion film 66, so that the heat in a cooing region 52 can be transported to a heat dissipation region 53 by the Ettingshausen effect in the thermoelectric conversion elements included in the thermoelectric conversion film 66.

Example 20

Figure 44:
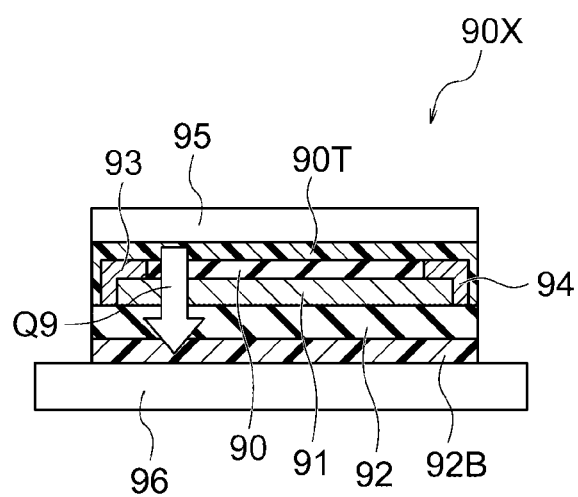
FIG. 44 is a cross-sectional view of a heat flow sensor according to Example 20.

FIG. 44 is a cross-sectional view of a heat flow sensor 90X according to Example 20. In the heat flow sensor 90X of Example 20, a first high thermal conductive insulating film 90 is provided on the first surface of a thermoelectric conversion film 91, and a second high thermal conductive insulating film 92 is provided on the second surface. Wiring lines 93 and 94 are connected to the thermoelectric conversion film 91. The thermoelectric conversion film 91 has the same configuration as that of the thermoelectric conversion film 15 described in Example 1. The first high thermal conductive insulating film 90 is formed with $Al_2O_3$, for example. The second high thermal conductive insulating film 92 is formed with MgO, for example, and is provided also as a support substrate that supports the thermoelectric conversion film 91. High thermal conductive silicon rubber sheets 90T and 92B are provided on the surface of the first high thermal conductive insulating film 90 on the opposite side from the thermoelectric conversion film 91 and the surface of the second high thermal conductive insulating film 92 on the opposite side from the thermoelectric conversion film 91, respectively.

In the heat flow sensor 90X, a heat source 95 is disposed on the surface of the high thermal conductive silicon rubber sheet 90T on the opposite side from the first high thermal conductive insulating film 90, and a heat bath 96 is disposed on the surface of the high thermal conductive silicon rubber sheet 92B on the opposite side from the second high thermal conductive insulating film 92. When a heat flux Q9 flowing from the heat source 95 to the heat bath 96 is generated, an electromotive force is generated in the thermoelectric conversion elements included in the thermoelectric conversion film 91 and magnetized in a predetermined direction due to the anomalous Nernst effect, and a voltage difference between the wiring lines 93 and 94 is output as an output signal of the heat flow sensor 90X. The positions of the heat source 95 and the heat bath 96 may be switched, and, in that case, an output signal having its sign inverted is output. The heat source 95 has a size equivalent to the area of the sensor surface of the heat flow sensor 90X, and is designed to apply a uniform heat flux to the entire sensor surface.

With the heat flow sensor 90X according to Example 20, when a heat flux flows into the thermoelectric conversion elements due to heat conduction via the high thermal conductive insulating film, an electromotive force is generated in the thermoelectric conversion elements, and an output signal corresponding to the magnitude of the heat flux is output, so that the heat flow can be detected. The heat flow sensor 90X has a simple configuration, and the length of the thermoelectric conversion elements in the longitudinal direction can be easily increased. Thus, the performance of the heat flow sensor 90X can be enhanced. Also, the thickness of the heat flow sensor 90X can be reduced, and accordingly, the device size can be made smaller. Further, efficient heat conduction can be performed via the first high thermal conductive insulating film 90 and the second high thermal conductive insulating film 92, and thus, the performance of the heat flow sensor 90X can be enhanced.

Example 21

Figure 45:
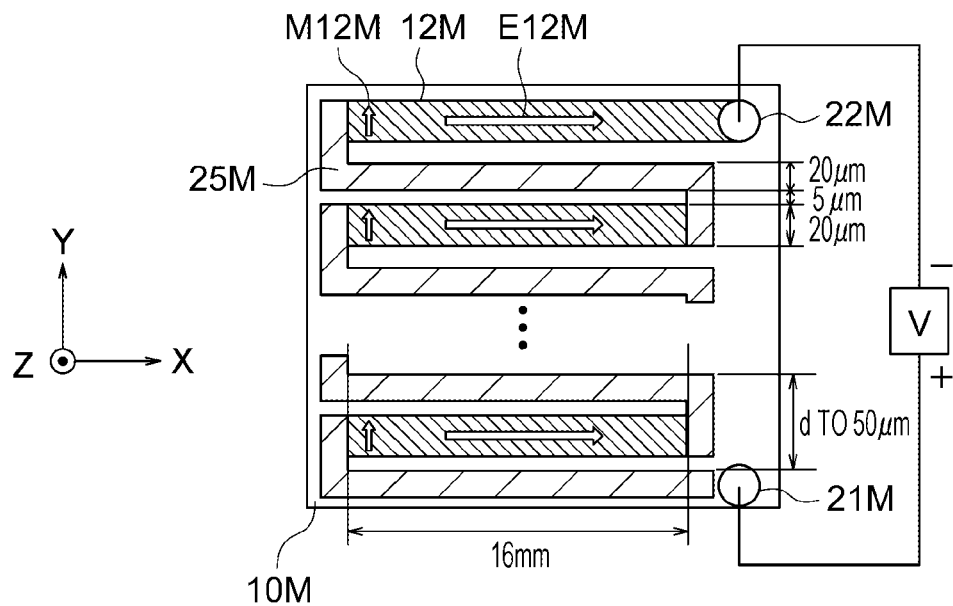
FIG. 45 is a diagram illustrating the layout in a thermoelectric conversion film of a heat flow sensor according to Example 21.

FIG. 45 illustrates the layout in a thermoelectric conversion film 91 of a heat flow sensor manufactured in Example 21. In Example 21, on a support substrate 10M, a plurality of thermoelectric conversion elements 12M is arranged in parallel in a direction perpendicular to the longitudinal direction (the X direction), and wiring lines 25M are provided so that one end portion (the −X direction) of a thermoelectric conversion element 12M in the longitudinal direction is connected to the other end portion (the +X direction) of another thermoelectric conversion element 12M adjacent to one side (the −Y direction) in the longitudinal direction. The first high thermal conductive insulating film 90 is removed at the end portion of the upper surface at each connecting portion between the thermoelectric conversion elements 12M and the wiring lines 25M, so that the thermoelectric conversion elements 12M and the wiring lines 25M are electrically connected. The thermoelectric conversion elements 12M and the wiring lines 25M are insulated from each other, except for the connecting portions. In this manner, the plurality of thermoelectric conversion elements 12M is electrically connected in series, and is provided in a meandering shape. The thermoelectric conversion elements 12M are magnetized in the +Y direction (the direction of magnetization M12M).

The configuration, except for the thermoelectric conversion film 91, is the same as that of Example 20. The first high thermal conductive insulating film 90 is provided on the first surface of the thermoelectric conversion film 91, and the second high thermal conductive insulating film 92 is provided on the second surface. In this example, the second high thermal conductive insulating film 92 also serves as the support substrate 10M that supports the thermoelectric conversion film 91.

When a heat flux is generated in the thermoelectric conversion elements 12M, an electromotive force E12M is generated in the +X direction in the thermoelectric conversion elements 12M due to the anomalous Nernst effect. The electromotive force E12M is output to the outside through the wiring lines 93 and 94 (see FIG. 44) connected at connecting portions 21M and 22M, and electromotive forces are added up in each of the adjacent thermoelectric conversion elements 12M. Thus, the output voltage V can be increased.

The second high thermal conductive insulating film 92 has a thickness of 0.5 mm, and is formed with MgO. The first high thermal conductive insulating film 90 has a thickness of 5 nm, and is formed with $Al_2O_3$. The thermoelectric conversion elements 12M have a thickness of 200 nm, and are formed with $Co_2MnGa$. The wiring lines 25M are formed with a stack of a 400-nm thick Au film and a 4-nm thick Ti film. The area of the sensor surface of the heat flow sensor is 20 mm×20 mm. The length of the thermoelectric conversion elements 12M in the X direction is 16 mm. The width of each thermoelectric conversion element 12M in the Y direction is 20 µm. The width of each wiring line 25M in the Y direction is 20 µm. The interval between a thermoelectric conversion element 12M and an adjacent wiring line 25M in the Y direction is 5 µm. The repetition width d of the thermoelectric conversion elements 12M in the Y direction (the sum of the width of a thermoelectric conversion element 12M in the Y direction, the width of a wiring line 25M in the Y direction, and the interval between the thermoelectric conversion element 12M and the wiring line 25M in the Y direction) is 50 µm. The thickness of each of the high thermal conductive silicon rubber sheets 90T and 92B is 0.5 mm.

The heat flow sensor of this example was prepared as follows. A 200-nm thick Co MnGa film and a 5-nm thick $Al_2O_3$ film were stacked on the second high thermal conductive insulating film 92 serving as the support substrate 10M by a sputtering method. A resist pattern as the pattern of the thermoelectric conversion elements 12M was formed by a photolithography process, and an Ar dry etching process was performed, to form the thermoelectric conversion elements 12M and the first high thermal conductive insulating film 90. Next, a resist pattern as the pattern of the wiring lines 25M was formed by a photolithography process, a 400-nm thick Au film and a 4-nm thick Ti film were stacked by a sputtering method, and the wiring lines 25M were formed by a lift-off technique. In the above process, the first high thermal conductive insulating film 90 was formed so as to be the same as the pattern of the thermoelectric conversion elements 12M. However, it is also possible to form the first high thermal conductive insulating film 90 on the entire sensor surface by forming the first high thermal conductive insulating film 90 after pattern etching of the thermoelectric conversion elements 12M.

Heat of a predetermined amount of heat transfer was applied from the heat source 95 to the heat flow sensor having the above configuration, and an output signal of the heat flow sensor with respect to the heat flux was examined. An auxiliary heat source (not illustrated) was provided on the surface of the heat source 95 on the opposite side from the first high thermal conductive insulating film 90, and adjustment was performed so that heat does not flow between the auxiliary heat source and the heat source 95. Thus, all the heat generated in the heat source 95 was applied to the heat flow sensor, and the application of heat was made uniform on the sensor surface. An oxygen-free copper plate was disposed as the heat bath 96 on the surface of the thermal conductive silicon rubber sheet 92B on the opposite side from the second high thermal conductive insulating film 92.

The amount of heat transfer (W) to be applied to the heat flow sensor was calculated by (current consumption)$^2$× resistance of the heater incorporated in the heat source 95. The resistance of the heater is 200Ω. The current consumption by the heater was changed, to change the amount of heat transfer.

Figure 46:
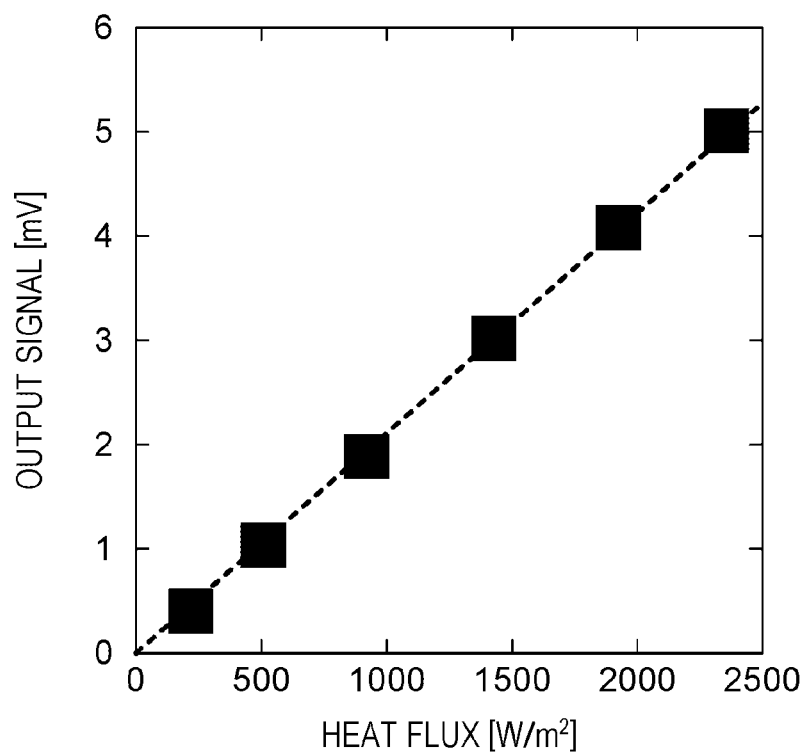
FIG. 46 is a graph illustrating the output signal with respect to heat flux in the heat flow sensor according to Example 21.

FIG. 46 is a graph illustrating the output signal with respect to the heat flux in the heat flow sensor according to Example 21. The abscissa axis of the graph indicates the heat flux (W/m$^2$), which is the value obtained by dividing the amount of heat transfer (W) to be applied to the heat flow sensor by the area (20 mm×20 mm) of the sensor surface of the heat flow sensor, and is also referred to as heat flux density. The ordinate axis of the graph indicates the output signal (mV) of the heat flow sensor. The output signal was obtained by calculating a half of the voltage difference generated when the magnetization direction of the thermoelectric conversion elements 12M was changed by 180°.

As illustrated in FIG. 46, the output signal of the heat flow sensor is proportional to the heat flux. The sensitivity of the heat flow sensor is indicated by the slope (output voltage/heat flux) of the graph in FIG. 46, and is 2.1 µV/(W/m$^2$). Thus, it has been confirmed that the heat flow sensor is highly sensitive as a heat flow sensor having a size of 20 mm square.

REFERENCE SIGNS LIST 1, 1e gas sensor
2 sensor unit
3 wiring line
4 power-supply signal processing unit
5 fan
6 intake path
7 exhaust path
10 heat insulating substrate
11 second high thermal conductive insulating film
12 first thermoelectric conversion element
13 second thermoelectric conversion element
14 low thermal conductive insulating film
15 thermoelectric conversion film
16 first high thermal conductive insulating film
17 catalyst portion
18 non-catalyst portion
19 heater
70, 71 cooling device
80, 81, 82 readout circuit
90X heat flow sensor

The invention claimed is:

1. A thermoelectric device comprising:
    a sheet-like or plate-like thermoelectric conversion film including a thermoelectric conversion element formed with a material exhibiting an anomalous Nernst effect that generates an electromotive force from heat;
    a high thermal conductive insulating film that is provided on a first surface of the thermoelectric conversion film, and is formed with an insulator having a higher thermal conductivity than the material of the thermoelectric conversion element;
    a catalyst portion formed with a catalyst that promotes a reaction of a gas contained in a fluid to cause a thermal change, the catalyst portion being on the side of at least the first surface of the thermoelectric conversion film and facing a flow path of the fluid;
    a non-catalyst portion that is provided on a surface of the high thermal conductive insulating film and formed with a material not exhibiting a catalytic action for the fluid; and
    a readout circuit that is connected to the thermoelectric conversion element and configured to read out a difference between an electromotive force generated in the thermoelectric conversion element due to heat from a region of the catalyst portion and an electromotive force generated in the thermoelectric conversion element due to heat from a region of the non-catalyst portion.

2. The thermoelectric device according to claim 1, wherein
    a structure including the thermoelectric conversion film, the high thermal conductive insulating film, the catalyst portion, and the non-catalyst portion has a cylindrical shape,
    a hollow portion of the structure serves as the flow path of the fluid, and
    the readout circuit is provided outside the structure.

3. The thermoelectric device according to claim 1, wherein the readout circuit is configured to read out a difference between an electromotive force generated in the thermoelectric conversion element before the fluid is introduced into the flow path, and an electromotive force generated in the thermoelectric conversion element when the fluid is introduced into the flow path.

4. The thermoelectric device according to claim 1, further comprising
    a second catalyst portion formed with a catalyst of a material different from that of the catalyst portion,
    wherein the catalyst portion and the second catalyst portion react with components different from each other, the components being of the fluid.

5. The thermoelectric device according to claim 1, wherein the high thermal conductive insulating film has a tensile stress.

6. The thermoelectric device according to claim 1, wherein the high thermal conductive insulating film is formed with at least one of AlN, SiC, SiN, BN, $Al_2O_3$ or MgO.

7. The thermoelectric device according to claim 1, wherein, as an interlayer insulating film, a low thermal conductive insulating film formed with an insulator having a lower thermal conductivity than the material of the thermoelectric conversion element is provided in the thermoelectric conversion film.

8. The thermoelectric device according to claim 1, wherein the thermoelectric device is a gas sensor that detects gas.

9. The thermoelectric device according to claim 1, wherein the thermoelectric conversion element exhibits an Ettingshausen effect, and the thermoelectric device is a cooling device.

10. The thermoelectric device according to claim 1, wherein the thermoelectric device is a heat flow sensor that detects heat flux.

11. The thermoelectric device according to claim 1, wherein
    the thermoelectric conversion film includes, as the thermoelectric conversion element, a first thermoelectric conversion element and a second thermoelectric conversion element that have a shape extending in one direction, are formed with the same material, and have magnetization in the same direction perpendicular to the one direction,
    the first thermoelectric conversion element and the second thermoelectric conversion element are arranged in parallel in a direction perpendicular to the one direction, and are electrically connected in series to have a meandering shape, and
    the catalyst portion is disposed at a position corresponding to the first thermoelectric conversion element on the surface of the high thermal conductive insulating film.

12. The thermoelectric device according to claim 11, wherein the non-catalyst portion is disposed at a position corresponding to the second thermoelectric conversion element on the surface of the high thermal conductive insulating film.

13. The thermoelectric device according to claim 1, further comprising a heater configured to set the fluid to a predetermined temperature.

14. The thermoelectric device according to claim 13, wherein the heater is disposed inside the flow path of the fluid.

15. The thermoelectric device according to claim 13, wherein the heater is disposed on a second surface side of the thermoelectric conversion film, and the second surface side is opposite to a first surface side where the catalyst portion is provided.

16. The thermoelectric device according to claim 13, wherein the heater is disposed along the catalyst portion on the surface of the high thermal conductive insulating film.

17. A thermoelectric device comprising:
    a sheet-like or plate-like thermoelectric conversion film including a thermoelectric conversion element formed with a material exhibiting an anomalous Nernst effect;
    a first high thermal conductive insulating film that is provided on a first surface of the thermoelectric conversion film, and is formed with an insulator having a higher thermal conductivity than the material of the thermoelectric conversion element;
    a catalyst portion that is provided on the first high thermal conductive insulating film and formed with a catalyst that promotes a reaction of a gas contained in a fluid to cause a thermal change;
    a second high thermal conductive insulating film that is provided on a second surface of the thermoelectric conversion film which is opposite to the first surface, and is formed with an insulator having a higher thermal conductivity than the material of the thermoelectric conversion element;
    a non-catalyst portion that is provided on the second high thermal conductive insulating film and formed with a material not exhibiting a catalytic action for the fluid; and a readout circuit that is connected to the thermoelectric conversion element and configured to read out a difference between an electromotive force generated in the thermoelectric conversion element due to heat from a region of the catalyst portion and an electromotive force generated in the thermoelectric conversion element due to heat from a region of the non-catalyst portion.

* * * * *